US008658332B2

(12) United States Patent
Askham

(10) Patent No.: US 8,658,332 B2
(45) Date of Patent: *Feb. 25, 2014

(54) PHOTOPOLYMER MEDIA WITH ENHANCED DYNAMIC RANGE

(71) Applicant: Akonia Holographics LLC, Longmont, CO (US)

(72) Inventor: Fredric R. Askham, Longmont, CO (US)

(73) Assignee: Akonia Holographics, LLC, Longmont, CO (US)

(*) Notice: Subject to any disclaimer, the term of this patent is extended or adjusted under 35 U.S.C. 154(b) by 0 days.

This patent is subject to a terminal disclaimer.

(21) Appl. No.: 13/667,724

(22) Filed: Nov. 2, 2012

(65) Prior Publication Data
US 2013/0059233 A1 Mar. 7, 2013

Related U.S. Application Data

(63) Continuation of application No. 12/765,987, filed on Apr. 23, 2010, now Pat. No. 8,323,854.

(60) Provisional application No. 61/171,949, filed on Apr. 23, 2009.

(51) Int. Cl.
G03H 1/02 (2006.01)
G03F 7/004 (2006.01)
G03F 7/035 (2006.01)

(52) U.S. Cl.
CPC ............ G03H 1/02 (2013.01); G03H 2260/31 (2013.01); G03H 2260/12 (2013.01); G03H 2260/54 (2013.01); G03H 7/028 (2013.01); G03F 7/035 (2013.01)
USPC .......... 430/1; 430/2; 430/331; 359/3

(58) Field of Classification Search
None
See application file for complete search history.

(56) References Cited

U.S. PATENT DOCUMENTS

| 4,634,657 | A |   | 1/1987  | Holman, III |
|-----------|---|---|---------|-------------|
| 4,942,112 | A | * | 7/1990  | Monroe et al. ............ 430/282.1 |
| 5,219,710 | A |   | 6/1993  | Horn et al. |
| 5,292,620 | A |   | 3/1994  | Booth et al. |
| 5,703,705 | A |   | 12/1997 | Curtis et al. |
| 5,719,691 | A |   | 2/1998  | Curtis et al. |
| 5,759,721 | A |   | 6/1998  | Dhal et al. |
| 5,874,187 | A |   | 2/1999  | Colvin et al. |

(Continued)

FOREIGN PATENT DOCUMENTS

| JP | 08-176090   | * | 7/1996 |
| JP | 2000-017003 | * | 1/2000 |

(Continued)

OTHER PUBLICATIONS

Yoon et al. "Novel photopolymers composed of thermoplastic and photoreactive binders for holographic application", J. Nonlin. Opt. Phys and Mater., vol. 13(3,4) pp. 569-574 (2004).*

(Continued)

Primary Examiner — Martin Angebranndt
(74) Attorney, Agent, or Firm — Akonia Holographics, LLC; Albert Haegele

(57) ABSTRACT

Dynamic range enhancing dopants for photopolymeric media are described. Also described are optical articles using these dopants and methods for making such optical articles.

16 Claims, 9 Drawing Sheets

(56) References Cited

U.S. PATENT DOCUMENTS

| | | | |
|---|---|---|---|
| 5,892,601 | A | 4/1999 | Curtis et al. |
| 5,932,045 | A | 8/1999 | Campbell et al. |
| 5,943,145 | A | 8/1999 | Curtis et al. |
| 6,103,454 | A | 8/2000 | Dhar et al. |
| 6,140,396 | A * | 10/2000 | Sugioka et al. ............... 524/99 |
| 6,162,579 | A * | 12/2000 | Stengel et al. ............ 430/272.1 |
| 6,191,875 | B1 | 2/2001 | Curtis et al. |
| 6,482,551 | B1 | 11/2002 | Dhar et al. |
| 6,614,566 | B1 | 9/2003 | Curtis et al. |
| 6,650,447 | B2 | 11/2003 | Curtis et al. |
| 6,697,180 | B1 | 2/2004 | Wilson et al. |
| 6,721,076 | B2 | 4/2004 | King et al. |
| 6,743,552 | B2 | 6/2004 | Setthachayanon et al. |
| 6,765,061 | B2 | 7/2004 | Dhar et al. |
| 6,780,546 | B2 | 8/2004 | Trentler et al. |
| 6,784,300 | B2 | 8/2004 | Cetin et al. |
| 6,798,547 | B2 | 9/2004 | Wilson et al. |
| 7,704,643 | B2 * | 4/2010 | Cole et al. ............................ 430/1 |
| 7,879,509 | B2 | 2/2011 | Stöckel et al. |
| 8,133,639 | B2 * | 3/2012 | Cole et al. ............................ 430/1 |
| 8,323,854 | B2 * | 12/2012 | Askham ................................ 430/1 |
| 2004/0027625 | A1 * | 2/2004 | Trentler et al. ..................... 359/3 |
| 2004/0179251 | A1 | 9/2004 | Anderson et al. |
| 2005/0036182 | A1 | 2/2005 | Curtis et al. |
| 2006/0194120 | A1 * | 8/2006 | Cole et al. ............................ 430/1 |
| 2007/0166625 | A1 | 7/2007 | Cole et al. |
| 2007/0231744 | A1 * | 10/2007 | Sasao et al. ..................... 430/281.1 |
| 2007/0248890 | A1 * | 10/2007 | Cole et al. ............................ 430/1 |
| 2008/0311482 | A1 | 12/2008 | Stockel et al. |
| 2008/0312403 | A1 * | 12/2008 | Stockel et al. ................... 528/59 |
| 2009/0053615 | A1 | 2/2009 | Tomari et al. |
| 2009/0068569 | A1 * | 3/2009 | Seta et al. ............................ 430/2 |
| 2009/0185470 | A1 | 7/2009 | Stoeckel et al. |
| 2010/0087564 | A1 | 4/2010 | Weiser et al. |

FOREIGN PATENT DOCUMENTS

| | | | |
|---|---|---|---|
| WO | 2006/095610 | A1 | 9/2006 |
| WO | 2007/046453 | A1 | 4/2007 |
| WO | 2009/054620 | * | 4/2009 |

OTHER PUBLICATIONS

David, "A study of the near infrared spectra of some aliphatic and aromatic isocyanates" Anal. Chem., vol. 35(1) pp. 37-44 (Jan. 1963).*

Final Office Action received for U.S. Appl. No. 12/765,987, mailed on May 9, 2012, 15 pages.

Non Final Office Action received for U.S. Appl. No. 12/765,987, mailed on Jan. 6, 2012, 13 pages.

Notice of Allowance received for U.S. Appl. No. 12/765,987, mailed on Aug. 2, 2012, 5 pages.

Booth et al., "Optical Interconnection Polymers", Polymers for Lightwave and Integrated Optics, Technology and Applications, 1992, pp. 231-266.

Dhar et al., "Recording Media that Exhibit High Dynamic Range for Holographic Storage", Optics Letters, vol. 24, 1999, pp. 487-489.

Hariharan, P. "Optical Holography: Principles, Techniques and Applications", Cambridge University Press, Cambridge, 1991, pp. 45-67.

Ludman et al., "Very Thick Holographic Nonspatial Filtering of Laser Beams", Optical Engineering, vol. 36, No. 6, 1997, pp. 1700-1705.

McLeod et al., "Micro-Holographic Multi-Layer Optical Disk Data Storage", Applied Optics, vol. 44, No. 16, Jun. 1, 2005, pp. 3197-3207.

Psaltis et al., "Holographic Memories", Scientific American, Jan. 1, 1995.

Reutenauer et al., "A New Route to Model (A2B) and Regular Graft Copolymers", Macromol., vol. 34, No. 4, 2001, pp. 755-760.

Shelby, R. M. "Media Requirements for Digital Holographic Data Storage", Holographic Data Storage, Section 1.3, Coufal, Psaltis, Sincerbox Eds., 2003, pp. 101-111.

Smothers et al., "Photopolymers for Holography", SPIE, vol. 1212, Practical Holography IV, 1990, pp. 20-29.

Solymar et al., "Volume Holography and Volume Gratings", 1981, pp. 315-327.

* cited by examiner

PHOTOPOLYMER MEDIA WITH ENHANCED DYNAMIC RANGE

CROSS-REFERENCE TO RELATED APPLICATIONS

This application claims priority to and incorporates by reference U.S. patent application Ser. No. 12/765,987, entitled PHOTOPOLYMER MEDIA WITH ENHANCED DYNAMIC RANGE, filed Apr. 23, 2010, issued Dec. 4, 2012 as U.S. Pat. No. 8,323,854, and claiming benefit of priority to U.S. Provisional Patent Application No. 61/171,949, entitled "METHOD FOR ENHANCEMENT OF DYNAMIC RANGE IN PHOTOPOLYMER MEDIA USING NOVEL CHEMICAL ADDITIVES," filed Apr. 23, 2009, which is also incorporated herein by reference in its entirety. The present application also makes reference to the following U.S. Patent Applications and U.S. Patents: U.S. patent application Ser. No. 12/210,476, entitled "LAYOUT METHOD FOR MULTIPLEXED HOLOGRAMS," filed Sep. 15, 2008. U.S. Provisional Patent Application No. 61/083,254, entitled "METHOD ALLOWING LOCALIZED GATING OF DIFFUSION PROPERTIES," filed Jul. 24, 2008. U.S. patent application Ser. No. 11/738,394, entitled "INDEX CONTRASTING-PHOTOACTIVE POLYMERIZABLE MATERIALS, AND ARTICLES AND METHODS USING SAME" filed Apr. 20, 2007. U.S. patent application Ser. No. 11/440,367, entitled "POST-CURING OF HOLOGRAPHIC MEDIA" filed May 25, 2006. U.S. patent application Ser. No. 11/237,883 , entitled "LOW CTE MEDIA FOR HOLOGRAPHIC RECORDING BY PROVIDING A SLIP LAYER BETWEEN THE MEDIA AND ITS SUBSTRATES" filed Sep. 29, 2005. U.S. patent application Ser. No. 11/067,010, entitled "HIGH FIDELITY HOLOGRAM DEVELOPMENT VIA CONTROLLED POLYMERIZATION" filed Feb. 28, 2005. U.S. patent application Ser. No. 10/866,823, entitled "THERMOPLASTIC HOLOGRAPHIC MEDIA" filed Jun. 15, 2004. The entire disclosure and contents of the above applications are incorporated herein by reference.

BACKGROUND

1. Field of the Invention

The present invention relates generally to high performance photopolymerizable recording materials for use in holography and other related fields. The present invention also relates generally to articles comprising such photopolymerizable materials. The present invention further relates generally to recording holograms with such articles.

2. Related Art

Developers of information storage devices and methods continue to seek increased storage capacity. As part of this development, holographic memory systems have been suggested as alternatives to conventional memory devices. Holographic memory systems may be designed to record data as one bit of information (i.e., bit-wise data storage). See McLeod et al. "Micro-Holographic Multi-Layer Optical Disk Data Storage," *International Symposium on Optical Memory and Optical Data Storage* (July 2005). Holographic memory systems may also be designed to record an array of data that may be a 1-dimensional linear array (i.e., a 1×N array, where N is the number linear data bits), or a 2-dimension array commonly referred to as a "page-wise" memory system. Page-wise memory systems may involve the storage and readout of an entire two-dimensional representation, e.g. a page of data. Typically, recording light passes through a two-dimensional array of low and high transparency areas representing data, and the system stores, in three dimensions, the pages of data holographically as patterns of varying refractive index imprinted into a storage medium. See Psaltis et al., "Holographic Memories," *Scientific American*, November 1995, where holographic systems are discussed generally, including page-wise memory systems.

In a holographic data storage system, information is recorded by making changes to the physical (e.g., optical) and chemical characteristics of the holographic storage medium. These changes in the holographic medium take place in response to the local intensity of the recording light. That intensity is modulated by the interference between a data-bearing beam (the data beam) and a non-data-bearing beam (the reference beam). The pattern created by the interference of the data beam and the reference beam forms a hologram, which may then be recorded in the holographic medium. If the data-bearing beam is encoded by passing the data beam through, for example, a spatial light modulator (SLM), the hologram(s) may be recorded in the holographic medium as an array of light and dark squares or pixels. The holographic medium or at least the recorded portion thereof with these arrays of light and dark pixels may be subsequently illuminated with a reference beam (sometimes referred to as a reconstruction beam) of the same or similar wavelength, phase, etc., so that the recorded data may be read. One type of holographic storage medium used recently for such holographic data storage systems are photosensitive polymer films. Photosensitive polymer films are considered attractive recording media candidates for high density holographic data storage. These films have a relatively low cost, are easily processed and can be designed to have large index contrasts with high photosensitivity. These films may also be fabricated with the dynamic range, media thickness, optical quality and dimensional stability required for high density applications. See, e.g., L. Dhar et al., "Recording Media That Exhibit High Dynamic Range for Holographic Storage," *Optics Letters*, 24, (1999): pp. 487 et. seq; Smothers et al, "Photopolymers for Holography," *SPIE OE/Laser Conference*, (Los Angeles, Calif., 1990), pp.: 1212-03.

The holographic storage media described in Smothers et al., supra contain a photoimageable system containing a liquid monomer material (the photoactive monomer) and a photoinitiator (which promotes the polymerization of the monomer upon exposure to light), where the photoimageable system is in an organic polymer host matrix that is substantially inert to the exposure light. During writing (recording) of data into the holographic medium, the monomer polymerizes in the exposed regions. Due to the lowering of the monomer concentration caused by the polymerization, monomer from the dark, unexposed regions of the material diffuses to the exposed regions. The polymerization and resulting diffusion create a refractive index change, thus forming the hologram representing the data. An important aspect to these systems is the mass transport from one region to another to create a large change in refractive index, which may provide a distinct advantage over photochromic systems.

The characteristics and capabilities of the holographic storage medium may depend upon or be affected by a number of factors, and especially the nature, properties, composition, etc., of the holographic medium. For example, the optical and chemical characteristics of a holographic medium may affect how the medium absorbs different wavelengths of light, the speed with which a particular wavelength of light is absorbed, how well or uniformly the medium records the holograms with respect to the particular wavelength of light, etc. In addition, the recording characteristics of the holographic medium may change as the various chemical components present in the medium are used up or formed, as the medium ages over time, etc. All of these factors may affect and may make less optimal the characteristics and capabilities of the holographic medium to record and/or read data.

Designing molecules for index contrast applications such holographic storage medium, holographic optical elements, waveguides and photolithography have previously concentrated on the use of photoactive monomers comprising a single high index-contrasting group attached to a reactive vinyl group (such as an acrylate) or epoxide. Such monomers are described in, for example, U.S. Pat. No. 5,759,721 (Dhal, et al.), issued Jun. 2, 1998; U.S. Pat. No. 5,874,187 (Colvin, et al.), issued Feb. 23, 1999; U.S. Pat. No. 6,103,454 (Dhar, et al.), issued Aug. 15, 2000; U.S. Pat. No. 6,482,551 (Dhar, et al.), issued Nov. 19, 2002; and U.S. Pat. No. 6,784,300 (Cetin, et al.), issued Aug. 31, 2004. Such monomers may form photopolymers having a high diffraction efficiency and high dynamic range.

There may, however, be other ways to improve the performance of photoactive monomers that form photopolymers having high diffraction efficiency, high dynamic range, as well as other desirable properties.

SUMMARY

According to a first broad aspect, the present invention provides an article comprising: a support matrix comprising a polyurethane; a photoactive monomer; a photoinitiator; and a dynamic range enhancing dopant; wherein the dynamic range enhancing dopant comprises a radical trap group and an immobilizing group; and wherein the article has a dynamic range that is 1.1 times or more the value of the dynamic range of the same article without the dynamic range enhancing dopant.

According to a second broad aspect, the present invention provides a method comprising the following steps: (a) polymerizing a material comprising a polyol component, an NCO component and a dynamic range enhancing dopant to form a support matrix; and (b) adding a photoinitiator and a photoactive monomer to the support matrix to thereby form an optical article; wherein the dynamic range enhancing dopant comprises a radical trap group and an immobilizing group; and wherein the article has a dynamic range that is 1.1 times or more the value of the dynamic range of the same article without the dynamic range enhancing dopant.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

DETAILED DESCRIPTION OF THE PREFERRED EMBODIMENTS

Definitions

Figure 1:
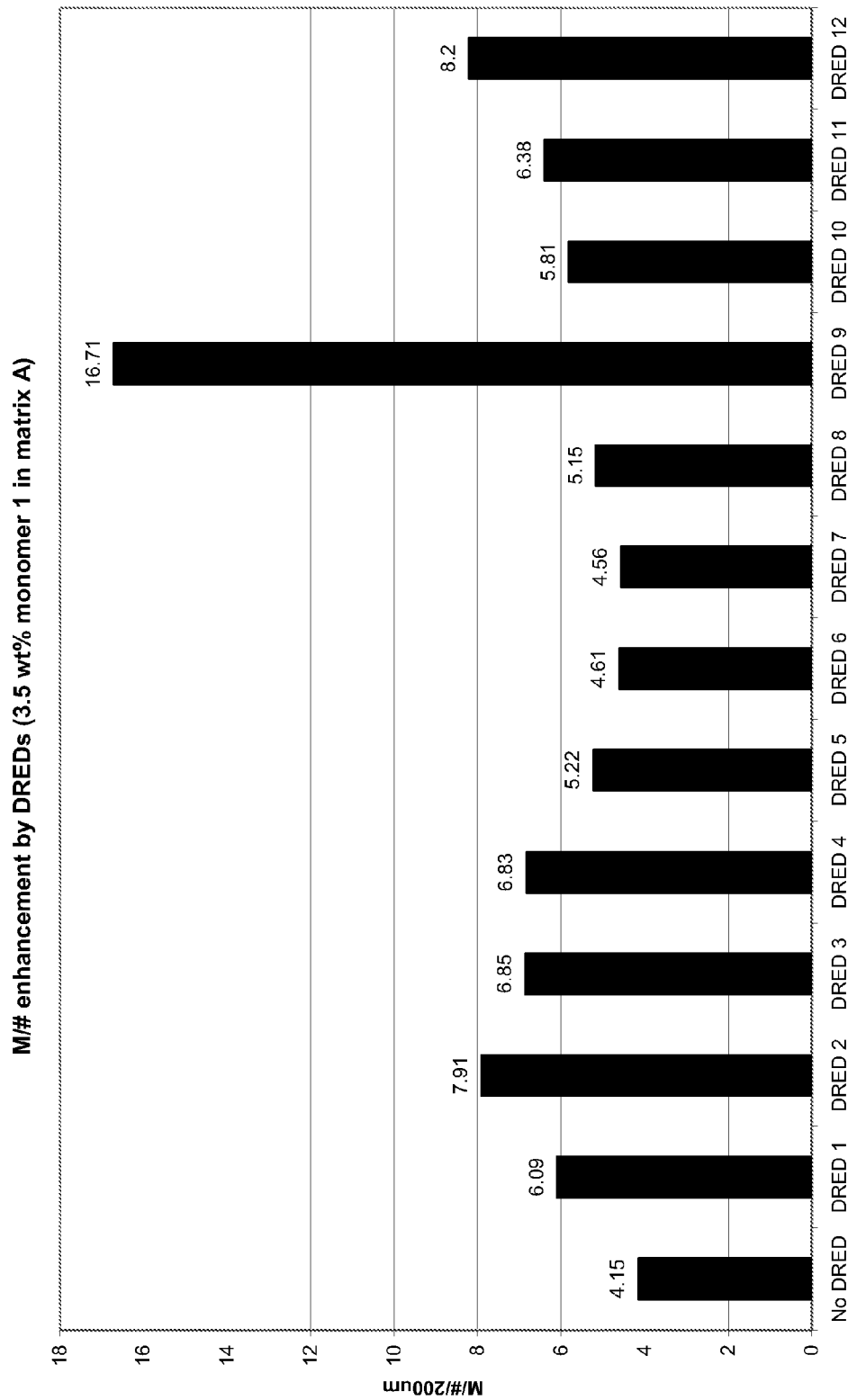
FIG. 1 is a graph showing M/#/200 μm for photopolymer media formulations of the present invention including different dynamic range enhancing dopant compounds of the present invention in which a monomer comprises 3.5 wt % of each formulation.

Where the definition of terms departs from the commonly used meaning of the term, applicant intends to utilize the definitions provided below, unless specifically indicated.

For the purposes of the present invention, the term "chain length" refers to the kinetic chain length, or the average degree of polymerization.

For the purposes of the present invention, the term "chain transfer" refers to interrupting the growth of a kinetic chain by formation of a new radical that may react as a new nucleus for forming a new polymeric molecular chain. Chain transfer may cause the formation of a higher proportion of shorter polymer chains, relative to polymerization reactions that occur without chain transfer.

For the purposes of the present invention, the term "coherent light beam" refers to a beam of light including waves with a particular (e.g., constant) phase relationship, such as, for example, a laser beam. A coherent light beam may also be referred to as light in which the phases of all electromagnetic waves at each point on a line normal to the direction of the light beam are identical, and may also include partially coherent light and light with finite or limited coherence length that many light sources have or provide.

For the purposes of the present invention, the term "covalently crosslinked" refers to the conventional meaning and use of this term, wherein one or more linear polymer chains are covalently bonded to other linear polymer chains to form a 3-dimensional network.

For the purposes of the present invention, the term "data beam" refers to a beam containing a data signal. For example, a data beam may include beams that have been modulated by a modulator such as a spatial light modulator (SLM), along with a beam generated in response to a reference beam impingent on a holographic storage medium, where the generated beam includes data. The modulation of the data beam may be an amplitude, a phase or some combination of the amplitude and phase. The SLM may be reflective or transmissive. The data beam may be modulated into a binary state or into a plurality of states.

For the purposes of the present invention, the term "data modulated beam" refers to a data beam that has been modulated by a modulator such as a spatial light modulator (SLM). The modulation of the data beam may be an amplitude, a phase or some combination of the amplitude and phase. The SLM may be reflective or transmissive. The data beam may be modulated into a binary state or into a plurality of states.

For the purposes of the present invention, the term "data modulator" refers to any device that is capable of optically representing data in a single bit or in one or two dimensions from a signal beam.

For the purposes of the present invention, the term "data page" or "page" refers to the conventional meaning of data page as used with respect to holography. For example, a data page may be a page of data, one or more pictures, etc., to be recorded or recorded in a holographic medium. Data may also include images (e.g., display holograms).

For the purposes of the present invention, the term "diffraction efficiency" of a recorded hologram refers to the fraction of light refracted into a reconstructed object or reference beam by the recorded hologram when illuminated with a beam of light at the same or similar position, angle, wavelength, etc., to the object or reference beam used to record that hologram.

For the purposes of the present invention, the terms "dynamic range" or "M/#" relate to an intrinsic property of a holographic storage medium and refer to the total response of that medium when portioned among the one or more holograms recorded in a common volume and related to the index change and material thickness of the holographic storage medium as well as the wavelength of light, optical geometry, etc. used to record holograms in the holographic storage medium See Shelby, "Media Requirements for Digital Holographic Data Storage," *Holographic Data Storage*, Section 1.3 (Coufal, Psaltis, Sincerbox Eds. 2003), the entire contents and disclosure of which is incorporated herein by reference.

For the purposes of the present invention the term "Dynamic Range Enhancing Dopant (DRED)" refers to a compound that when added in small amounts to a formulation for a photopolymer based holographic storage medium substantially increases the M/# performance of the holographic storage medium without substantially increasing the physical shrinkage typically observed upon recording and is not in and of itself a writing monomer. A DRED includes two functional groups: a radical trap group and an immobilizing group. A radical trap group is a group to which a growing polymer chain, formed from the monomer in a holographic storage medium during data recording, can add, thereby becoming covalently attached to the DRED. Examples of radical trap groups are: alkenyl groups, nitro groups, nitrone groups, aminoxyl groups, etc. An immobilizing group is able to covalently attach the DRED to a polyurethane support matrix during the formation of the polyurethane support matrix of a holographic storage medium. Examples of immobilizing groups are hydroxyl groups, amine groups, carboxylic acid groups, isocyanate groups, etc.

For the purposes of the present invention, the term "fractal multiplexing" refers to multiplexing where the angle is changed in a direction that is not as Bragg selective until the reconstruction is moved off the detector (e.g., camera).

For the purposes of the present invention, the term "free radical polymerization" refers to any polymerization reaction that is initiated by any molecule comprising a free radical or radicals.

For the purposes of the present invention, the term "holographic data" refers to data recorded, stored, written, etc., in the holographic storage medium as one or more holograms.

For the purposes of the present invention, the terms "holographic grating," "holograph" or "hologram" (collectively and interchangeably referred to hereafter as "hologram") are used in the conventional sense of referring to an interference pattern formed when a signal beam and a reference beam interfere with each other. In cases wherein digital data is recorded page-wise, the signal beam may be encoded with a data modulator, e.g., a spatial light modulator, to provide a data beam.

For the purposes of the present invention, the term "holographic recording" refers to the act of recording, storing, writing, etc., a hologram in a holographic storage medium. The holographic recording may provide bit-wise storage (i.e., recording of one bit of data), may provide storage of a 1-dimensional linear array of data (i.e., a 1×N array, where N is the number linear data bits), or may provide 2-dimensional storage of a page of data.

For the purposes of the present invention, the term "holographic storage medium" refers to a component, material, etc., that is capable of recording and storing, in three dimensions (i.e., the X, Y and Z dimensions), one or more holograms (e.g., bit-wise, linear array-wise or page-wise) as one or more patterns of varying refractive index imprinted into the medium. The holographic storage medium (which may also be referred to interchangeably as a "holographic recording medium" or a "photoimageable system") at least comprises a support matrix in which is dispersed at least one photoactive polymerizable material. Examples of a holographic storage medium that may be adapted for use in the present invention include, but are not limited to, those described in: U.S. Pat. No. 6,103,454 (Dhar et al.), issued Aug. 15, 2000; U.S. Pat. No. 6,482,551 (Dhar et al.), issued Nov. 19, 2002; U.S. Pat. No. 6,650,447 (Curtis et al.), issued Nov. 18, 2003, U.S. Pat. No. 6,743,552 (Setthachayanon et al.), issued Jun. 1, 2004; U.S. Pat. No. 6,765,061 (Dhar et al.), Jul. 20, 2004; U.S. Pat. No. 6,780,546 (Trentler et al.), issued Aug. 24, 2004; U.S. Patent Application No. 2003/0206320 (Cole et al.) published Nov. 6, 2003; U.S. Patent Application No. 2004/0027625 (Trentler et al.), published Feb. 12, 2004; and U.S. Patent Application No. 2009/0185470 (Stoeckel et al.), published Jul. 23, 2009, the entire disclosure and contents of which are incorporated herein by reference. The holographic storage medium may comprise photopolymers, photo-chromatic, materials, photo-refractive materials, etc. A holographic storage medium may be any type, including: a transparent holographic storage medium, a holographic storage medium including a plurality of components or layers such as a reflective layer, a holographic storage medium including a reflective layer and a polarizing layer so reflection may be controlled with polarization, a holographic storage medium including variable beam transmission layer that may be pass, absorb, reflect, be transparent to, etc., light beams, grating layers for reflecting light beams, substrates, substrates with servo markings, etc. A holographic storage medium may be highly transmissively flat (thus making multiplexing easier and better) or not flat. All holographic storage mediums described herein may be, for example, in the shape, form, etc., of a disk, card, flexible tape media, etc.

For the purposes of the present invention, the term "increase the ability of the holographic storage medium to stably write holograms" refers to the ability to not only write holograms, but also to write holograms without the holograms degrading, disappearing, dissipating, etc., over time, i.e., form stable holograms. Increasing the ability to write stable holograms may also include imparting to the pre-cured portion of the holographic storage medium a relatively advantageous media response behavior in writing holograms.

For the purposes of the present invention, the term "index" refers interchangeably to the index of refraction or refractive index.

For the purposes of the present invention, the term "index contrast" refers to the ability of a material to create spatially distinct volumes of higher or lower indices of refraction. For example, in a higher index-contrasting monomer polymerized in a lower index-contrasting support matrix by using an interference pattern generated by crossed laser light, the pattern of the polymerized monomer mimics this interference pattern and thus creates volumes of material that have a higher refractive index (where light intensity is higher) and volumes of material that have a lower refractive index (where light intensity is lower or zero). Any refractive index contrast may allow one to control the direction that light travels by refraction or diffraction. In embodiments of the present invention, the average index contrast between the photoactive polymerizable material and the support matrix may be greater than about 0.1, for example, greater than about 0.2, more typically, greater than about 0.3. The average index contrast may be measured by direct measurement of the refractive index, molar refractive index calculations, solution refractive index methods, holographic measurement of $\Delta n$ (most typically), etc., well known to those skilled in the art.

For the purposes of the present invention, the term "index-contrasting group" refers to those parts of the photoactive polymerizable material which may lend themselves to creating a refractive index contrast between the support matrix and the photoactive polymerizable material after exposure to a photoinitiating light source to, for example, record holograms. This refractive index contrast may be created by having the index-contrasting groups provide either higher or lower (often higher) refractive index contrast between the photopolymer resulting from the photoactive polymerizable material and the support matrix. Index-contrasting groups having a higher refractive index may be comprised of polarizable atoms and groups of atoms. For example, suitable index-contrasting groups may include one or more of bromine, chlorine, sulfur, phosphorous, benzene rings, naphthalene rings, trityl groups, biphenyls, conjugated enes or ketones, etc. For embodiments of the present invention, the index-contrasting group may often refer to the collection of index-contrasting groups that provide the majority of the index contrast for the photoactive polymerizable material. For example, a brominated benzene ring attached to a benzophenone moiety may be attached to a linker moiety and then to an acrylate moiety would contain one index-contrasting group comprising both the brominated benzene and the benzophenone group. In certain embodiments, the geometry for the index-contrasting group is such that the individual components comprising the index-contrasting group are centrally located with linking moieties or reactive groups extending away from the index-contrasting group.

For the purposes of the present invention, the terms "index-contrasting structures" or "refractive index structures" or "index structures" or "index regions" refer collectively to those volumes in a material that have a different refractive index compared to other volumes in a material.

For the purposes of the present invention, the term "light source" refers to a source of electromagnetic radiation having a single wavelength or multiple wavelengths. The light source may be from a laser, one or more light emitting diodes (LEDs), etc. In some embodiments, the light source may have a wavelength of between about 200 nm and about 1000 nm.

For the purposes of the present invention, the term "multiplexing" refers to writing a plurality of holograms in the same volume or nearly the same volume of the holographic storage medium by varying a writing parameter(s) including, but not limited to, angle, wavelength, phase code, polytopic, shift, correlation, peristrophic, fractal, etc., including combinations of parameters, e.g., angle-polytopic multiplexing. For example, angle multiplexing involves varying the angle of the plane wave or nearly plane wave of the reference beam during writing to store a plurality of holograms in the same volume. The multiplexed holograms that are written may be, recovered by using/changing the same writing parameter(s) used to write the respective holograms. For the purposes of the present invention, the term "polytopic multiplexing" refers to a multiplexing method or technique where the writing stacks of holograms is spatially overlapped. The spacing between books may be at least the beam waist, which is the narrowest part of the signal beam. An aperture may be placed in the system at the beam waist. During recovery, all of the overlapped holograms at a given multiplexing angle may be recovered, but only the hologram that is centered in the aperture is passed through to the recovery optics. Examples of polytopic recording techniques that may be used in various embodiments of the present invention are described in U.S. Pat. App. No. 2004/0179251 (Anderson et al.), published Sep. 16, 2004; and U.S. Pat. App. No. 2005/0036182 (Curtis et al.), published Feb. 17, 2005, the entire disclosure and contents of which are incorporated herein by reference.

For the purposes of the present invention, the term "optical article" refers to an article comprising a holographic medium and other optional structures, components, elements, materials, etc., such as, for example, substrates, antireflective and/or scratch resistant coatings, labeling, cartridges, hubs, etc. Examples of optical articles may include recording media, waveguides, beam or optical filters, beam steerers or deflectors, optical couplers, etc.

For the purposes of the present invention, the term "organic radical" refers to the conventional meaning of the term "organic radical", i.e., a radical of an organic compound. Examples of organic radicals include: —C(CH$_3$)$_2$NCO, —CH$_2$OH, —COOH, —COOCH$_2$CH$_2$OH, —C$_6$H$_5$COOCH$_2$CH$_2$OH, —C$_6$H$_5$COOH, —C$_6$H$_5$CH$_2$OH etc.

For the purposes of the present invention, the term "percentage of dynamic range used" refers to how much of the dynamic range of a holographic storage medium has been used, relative to the total dynamic range capacity of the medium. For example, assuming all multiplexed holograms overlapping in a given volume have an equal diffraction efficiency, M/#, the diffraction efficiency (DE) may be related by the following equation: $DE=((M/\#)/n)^2$, wherein n is the number of holograms multiplexed in that volume.

For the purposes of the present invention, the term "photoactive polymerizable material" refers to a photoactive monomer, a photoactive oligomer or combinations thereof that polymerize when exposed to a photoinitiating light source, e.g., recording light, either in the presence or absence of a photoinitiator that has been activated by the photoinitiating light source. In reference to the reactive functional group that undergoes polymerization, the photoactive polymerizable material comprises at least one such reactive functional group. The photoactive polymerizable material also comprises at least one index-contrasting group. It is also understood that there exist photoactive polymerizable materials that may also comprise photoinitiators, such as, for example, N-methylmaleimide, acrylate derivatized acetophenones, etc. In such a case, it is understood that the photoactive polymerizable material may also be a photoinitiator.

For the purpose of the present invention, the term "photoinitiator" refers to the conventional meaning of the term photoinitiator and also refers to sensitizers and dyes. In general, a photoinitiator causes the light initiated polymerization of a material, such as a photoactive polymerizable material, when the photoinitiator is exposed to light of a wavelength that activates the photoinitiator, i.e., a photoinitiating light source. The photoinitiator may refer to a combination of components, some of which individually are not light sensitive, yet in combination are capable of initiating polymerization of a polymerizable material (e.g., a photoactive polymerizable material), examples of which may include a dye/amine, a sensitizer/iodonium salt, a dye/borate salt etc. The term photoinitiator may also refer to a single photoinitiator or to a combination of two or more photoinitiators. For example, two or more photoinitiators may be used to allow recording at two or more different wavelengths of light.

For the purposes of the present invention, the term "photoinitiator component" refers to a single photoinitiator or a combination of two or more photoinitiators. For example, two or more photoinitiators may be used in the photoinitiator component to allow recording at two or more different wavelengths of light.

For the purposes of the present invention, the term "photoinitiating light source" refers to a light source that activates a photoinitiator, a photoactive polymerizable material, a photoreactive material or any combination thereof. Photoinitiating light sources may include recording light, etc.

For the purposes of the present invention, the term "photopolymerization" refers to any polymerization reaction caused by exposure to a photoinitiating light source.

For the purposes of the present invention, the term "photopolymer" refers to a polymer formed by one or more photoactive polymerizable materials, and possibly one or more additional monomers and/or oligomers.

For the purposes of the present invention, the term "polymerizable component" refers to a mixture of one or more photoactive polymerizable materials, and possibly one or more additional polymerizable materials (i.e., monomers and/or oligomers) that are capable of forming a polymer.

For the purposes of the present invention, the term "primary reactive group" refers to a primary group, as distinct from secondary or tertiary group, as this term is conventionally used in chemistry. For example, butyl acrylate is a primary acrylate, and butyl methacrylate is a primary methacrylate, but butyl methacrylate is a secondary alkene, while butyl acrylate may be referred to as a primary alkene.

For the purposes of the present invention, the term "reactive functional group" refers to a functional group responsible for polymerization of the photoactive polymerizable material. For example, suitable reactive functional groups may include the following: ethylenic unsaturation (i.e., one or more double bonds, such as acrylates, methacrylates, acrylamides, methacrylamides, styrenes, substituted styrenes such as methyl styrene, etc., vinyl naphthalenes, substituted vinyl naphthalenes, other vinyl polyaromatics, vinylcyclohexene, vinylcyclohexene dioxide, vinylcyclohexene monoxide, vinyl esters, vinyl ethers, vinyl carbazoles, other vinyl derivatives, cycloalkenes, cyclic ethers (e.g., epoxide, glycidyl ether, allyl glycidyl ether, etc.), cyclic carbonates, cyclic esters, dioxalanes, etc.

For the purposes of the present invention, the term "reading data" refers to retrieving, recovering, or reconstructing holographic data stored in a holographic medium.

For the purposes of the present invention, the term "recordable section of the holographic storage medium" refers to that portion or portions of the holographic storage medium to which holograms may written.

For the purposes of the present invention, the term "recording data" refers to writing or storing holographic data in a holographic medium.

For the purposes of the present invention, the term "recording light" refers to a light source used to write holograms to a holographic storage medium.

For the purposes of the present invention, the term "reference beam" refers to a beam of light not modulated with data. Exemplary reference beams include non-data bearing laser beams used while writing holograms to, or recovering holograms from, a holographic storage medium. In some embodiments, the reference beam may refer to the original reference beam used to write the hologram, to a reconstruction beam when used to recover holograms from the holographic storage medium, or to the phase conjugate of the original reference (reconstruction) beam.

For the purposes of the present invention, the term "refractive index contrast ($\Delta n$)" is as conventionally known, and is defined as the amplitude of the sinusoidal variations in the refractive index of a material in which a plane-wave, volume hologram has been written. The refractive index may vary as: $n(x)=n_0+\Delta n \cos(K_x)$, wherein $n(x)$ is the spatially varying refractive index, x is the position vector, K is the grating wave vector, and n 0 is the baseline refractive index of the medium. See, e.g., P. Hariharan, Optical Holography: Principles, Techniques and Applications, Cambridge University Press, Cambridge, 1991, pg. 44, the entire disclosure and contents of which is incorporated herein by reference. The $\Delta n$ of a material may be calculated from the diffraction efficiency or efficiencies of a single volume hologram or a multiplexed set of volume holograms recorded in a medium.

For the purposes of the present invention, the term "refractive index profile" refers to a three-dimensional (X, Y, Z) mapping of the refractive index pattern recorded in a holographic storage medium.

For the purposes of the present invention, the term "room temperature" refers to the commonly accepted meaning of room temperature, i.e., an ambient temperature of 20°-25° C.

For the purposes of the present invention, the term "sensitivity" refers to the energy required to generate a measured amount of index contrast.

For the purposes of the present invention, the term "shrinkage" refers to a decrease in volume that normally accompanies the transition from polymerizable material to polymer. Not all polymerizable materials produce shrinkage. For many embodiments, shrinkage may be less than about 5 volume %, for example, less than about 1 volume %, and more typically between 0 and about 0.15 volume %. Conversely, expansion may also occur in some embodiments (e.g., as may happen with some ring opening polymerizations).

For the purposes of the present invention, the term "spatial light intensity" refers to a light intensity distribution or pattern of varying light intensity within a given volume of space.

For the purposes of the present invention, the term "spatial light modulator" (SLM) refers to a device that stores information on a light beam by, for example, modulating the spatial intensity and/or phase profile of the light beam.

For the purposes of the present invention, the term "storage medium" refers to any component, material, etc., capable of storing information, such as, for example, a holographic storage medium.

For the purposes of the present invention, the term "substrate" refers to components, materials, etc., such as, for example, glass plates or plastic plates, which are associated with the holographic medium, and which may provide a supporting structure for the holographic medium. Substrates may also optionally provide other beneficial properties for the article, e.g., rendering the holographic medium optically flat, providing a barrier to water vapor, providing a surface for antireflective coatings, etc.

For the purposes of the present invention, the term "support matrix" refers to a polymeric material, medium, substance, etc., which provides both an index contrast in recording and which also retains the recorded structures (archival stability). The support matrix may be a thermoplastic or a thermoset material The support matrix may be formed separately and by different chemistries from the photoactive polymerizable material used to record holograms (e.g., two-component systems), as described in commonly-assigned U.S. Pat. No. 6,482,551 (Dhar et al.), issued Nov. 19, 2002, the entire disclosure and contents of which is incorporated herein by reference. The support matrix also contains substantially few to zero index contrasting groups contained in the photoactive polymerizable material. The support matrix may be designed to allow the photoactive polymerizable material to diffuse through and to be miscible with/dispersible within the support matrix such that very little light scatter occurs (e.g., either before or after photopolymerization of the photoactive polymerizable material).

For the purposes of the present invention, the term "thermoplastic" refers to the conventional meaning of thermoplastic, i.e., a composition, compound, material, medium, substance, etc., that exhibits the property of a material, such as a high polymer, that softens when exposed to heat and generally returns to its original condition when cooled to room temperature. Examples of thermoplastics include, but are not limited to: poly(methyl vinyl ether-alt-maleic anhydride), poly(vinyl acetate), poly(styrene), poly(ethylene), poly(propylene), cyclic olefin polymers, poly(ethylene oxide), linear nylons, linear polyesters, linear polycarbonates, linear polyurethanes, etc.

For the purposes of the present invention, the term "thermoset" refers to the conventional meaning of thermoset, i.e., a composition, compound, material, medium, substance, etc, that is crosslinked such that it does not have a melting temperature, and cannot be dissolved in a solvent, but which may be swelled by a solvent. Examples of thermoset materials may include crosslinked poly(urethanes), crosslinked poly (acrylates), crosslinked poly(styrene), etc.

For the purposes of the present invention, the term "transmission" refers to transmission of a light beam from one component, element, article, etc., to another component, element, article, etc.

For the purposes of the present invention, the terms "recording," "storing," and "writing" (collectively and interchangeably referred to hereafter as "writing") refer to recording, storing or writing holograms to and/or into a holographic storage medium.

For the purposes of the present invention, the term "X-Y plane" typically refers to the plane defined by the substrates or the holographic medium that encompasses the X and Y linear directions or dimensions. The X and Y linear directions or dimensions are typically referred to herein, respectively, as the dimensions known as length (i.e., the X-dimension) and width (i.e., the Y-dimension).

For the purposes of the present invention, the terms "Z-direction" and "Z-dimension" refer interchangeably to the linear dimension or direction perpendicular to the X-Y plane, and is typically referred to herein as the linear dimension known as thickness.

Description

Photopolymer based photonic materials find relevance in a wide range of applications including holographic data storage, display holography, holographic and graded refractive index (GRIN) optical elements, waveguides, etc. Their importance stems from an ability to respond to a patterned light intensity by forming a corresponding permanent refractive index structure within the material. The effectiveness of a particular material derives largely from the maximum contrast which can be achieved as the initially homogeneous material is induced to separate into volumes of high and low refractive index.

Previous strategies for producing materials with greater dynamic range have included widening the difference in refractive index between monomer and matrix by judicious choice of their compositional elements, or simply increasing the initial concentration of the writing monomer. While these methods have achieved some success, practical constraints due to recording induced physical shrinkage, solubilities and expense limit the degree to which they can be employed.

The present invention provides a way to increase the dynamic range performance of these materials that does not rely on manipulating the refractive index characteristics of either the matrix or the monomer, or increasing the amount of writing monomer present. Instead, the present invention dramatically increases the efficiency with which the monomer is used in producing the requisite refractive index contrast.

The present invention employs a class of compounds having certain structural features that dramatically increase the dynamic range (as measured by M/#) when these compounds are included in photopolymer based holographic media. When added in small amounts to existing formulations these compounds, which may be referred to as "Dynamic Range Enhancing Dopant" (DRED) compounds, are capable, in some embodiments of the present invention, of quadrupling the material's M/# performance of a holographic storage medium during recording of pages to the holographic storage medium without substantially increasing the physical shrinkage typically observed upon recording. This characteristic of an increased M/# to shrinkage ratio is especially important in applications where high dynamic range is desirable but low recording induced physical shrinkage is critical (e.g., holographic data storage media). DRED compounds of the present invention may be used with a range of different monomers and matrices.

In one embodiment, the dynamic range enhancing dopant of the present invention is a compound of formula (1):

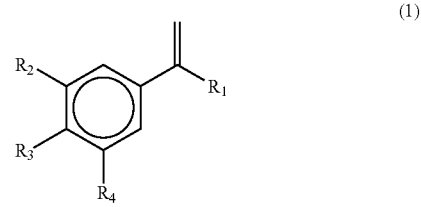

wherein:
R1 is an organic radical;
R2 is H, C(CH$_3$)$_2$NCO or CX$_3$, where X is a halogen;
R3 is H or COOCH$_2$CH$_2$OH; and
R4 is H or CX$_3$, where X is a halogen; and
wherein R1, R2, R3 or R4 comprises an immobilizing group.

In one embodiment, the dynamic range enhancing dopant of the present invention is a compound of formula (2):

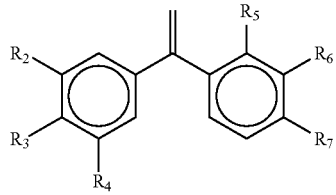
(2)

wherein:
R2 is H, C(CH$_3$)$_2$NCO or CX$_3$, where X is a halogen;
R3 is H or COOCH$_2$CH$_2$OH; and
R4 is H or CX$_3$, where X is a halogen; and
wherein R1 comprises an immobilizing group;
wherein:
R5 is H, CH$_2$OH, COOH or COOCH$_2$CH$_2$OH;
R6 is H or COOCH$_2$CH$_2$OH; and
R7 is H or COOCH$_2$CH$_2$OH.

In one embodiment, the dynamic range enhancing dopant of the present invention is a compound of formula (3):

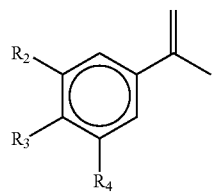
(3)

wherein:
R2 is H, C(CH$_3$)$_2$NCO or CX$_3$, where X is a halogen;
R3 is H or COOCH$_2$CH$_2$OH; and
R4 is H or CX$_3$, where X is a halogen; and
wherein R2, R3 or R4 comprises an immobilizing group.

In one embodiment, the dynamic range enhancing dopant of the present invention is a compound of formula (4):

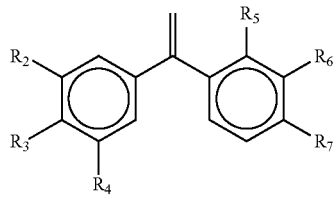
(4)

wherein:
R5 is H, CH$_2$OH, COOH or COOCH$_2$CH$_2$OH;
R6 is H or COOCH$_2$CH$_2$OH; and
R7 is H or COOCH$_2$CH$_2$OH.

In one embodiment, the dynamic range enhancing dopant of the present invention is the compound having the following structural formula:

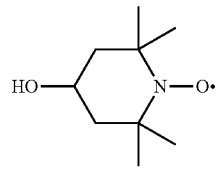

In one embodiment, the dynamic range enhancing dopant of the present invention is a compound of formula (5):

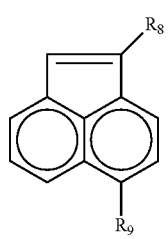
(5)

wherein:
R8 is H, CO$_2$CH$_2$CH$_2$OH or 3,5-(CF$_3$)$_2$C$_6$H$_3$; and
R9 is H or CH$_2$OH.

In one embodiment, the dynamic range enhancing dopant of the present invention is the compound:

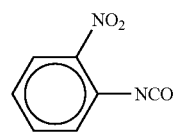

Examples of dynamic range enhancing dopants that may be used in the present invention include compounds DRED 1, DRED 2, DRED 3, DRED 4, DRED 5, DRED 6, DRED 7, DRED 8, DRED 9, DRED 10, DRED 11, DRED 12, DRED 13 the structural formulas of which are depicted below:

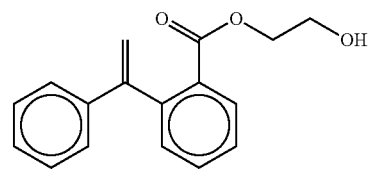
DRED 1

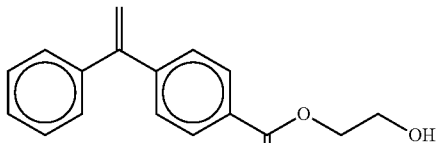
DRED 2

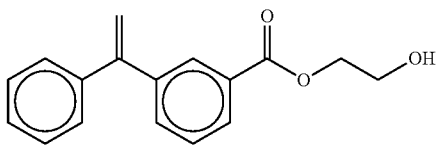
DRED 3

-continued

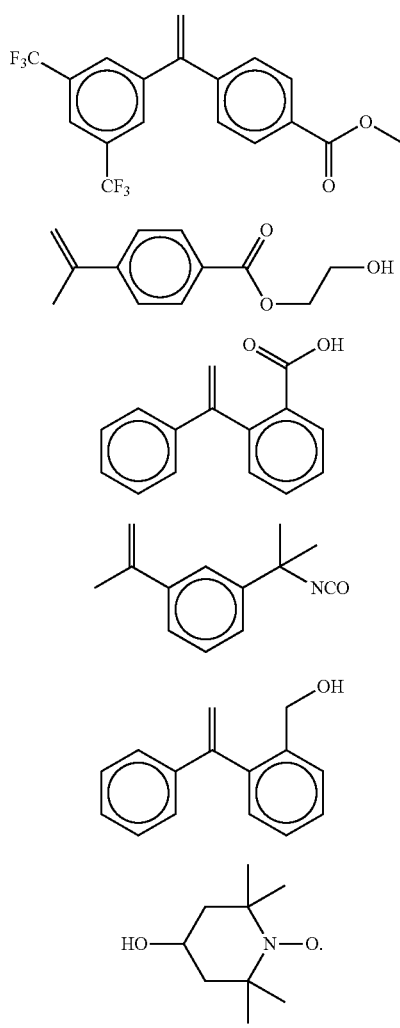

DRED 4

DRED 5

DRED 6

DRED 7

DRED 8

DRED 9

DRED 9 is also known as 4-hydroxy-2,2,6,6-tetramethylpiperidine-1-oxyl or 4-hydroxy TEMPO or TEMPOL. The radical trap group NO. is an aminoxyl group.

DRED 10

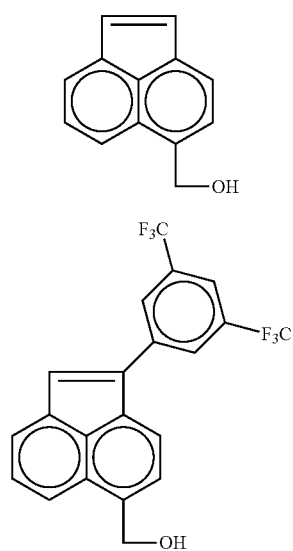

DRED 11

DRED 12

DRED 13

When added in small amounts to existing photopolymer based media formulations, the DRED compounds of the present invention produce new media with significantly enhanced dynamic range characteristics. For example, FIG. 1 depicts the measured M/# performance of formulations containing different DRED compounds while all other formulation variables are held constant. As can be seen, the magnitude of the effect may be large and depends upon the specific DRED compound chosen.

Figure 2:
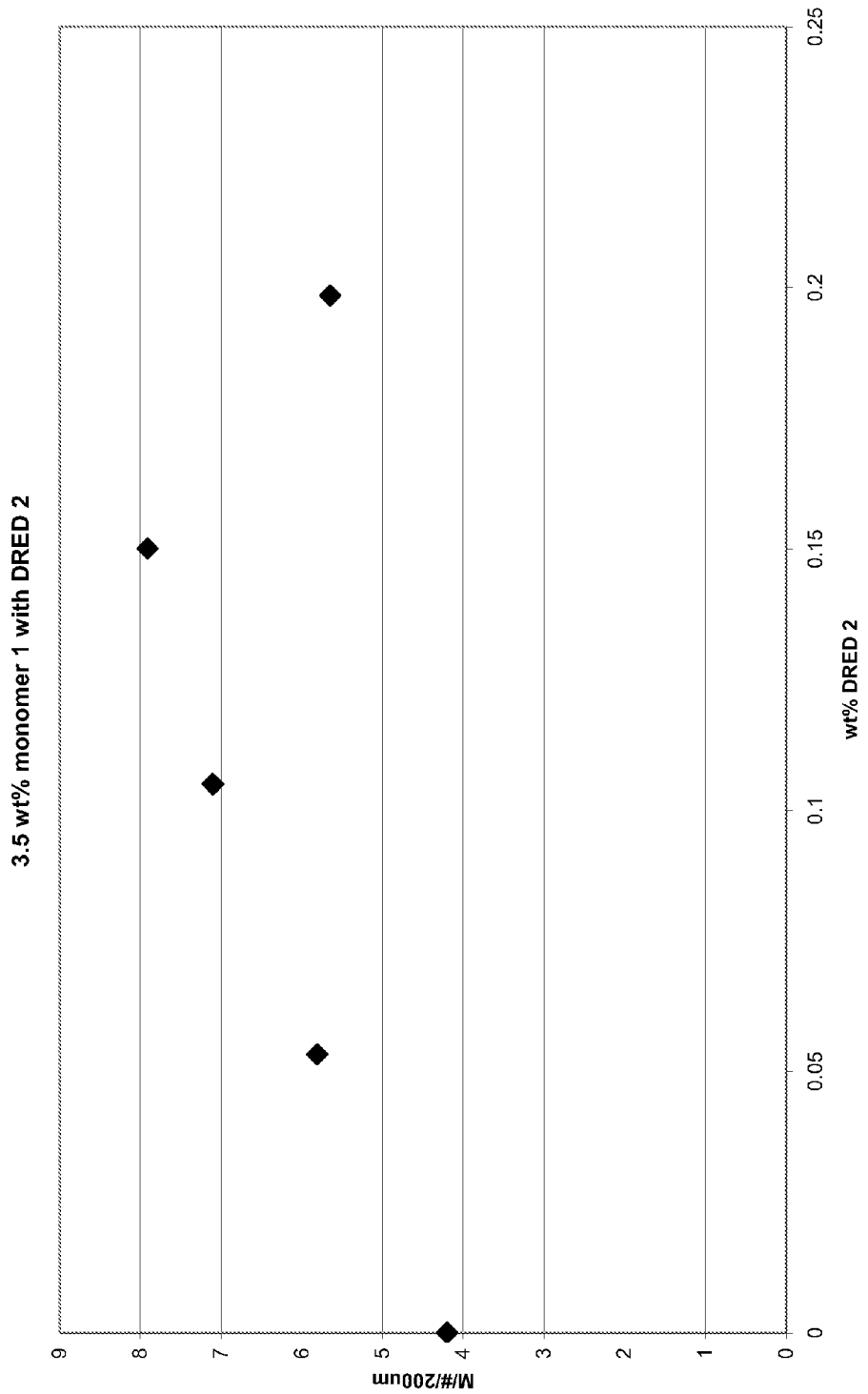
FIG. 2 is a graph showing M/#/200 μm for photopolymer media formulations of the present invention including different concentrations of a dynamic range enhancing dopant compound of the present invention in which a monomer comprises 3.5 wt % of each formulation.

The observed dynamic range increase also depends upon the amount of DRED compound used, as shown by FIG. 2 which shows the effect on dynamic range of various concentrations of DRED 2. In many cases the dynamic range for a holographic storage medium reaches a maximum at values with a DRED compound concentration well below 1 wt %. Details of the shape of the M/# versus wt % DRED compound curves, including the position of the maximum, depend somewhat upon the amount of monomer used in the formulation, as is clear from comparison of FIG. 2 (3.5 wt % monomer) with FIG. 3 (2 wt % monomer).

Figure 4:
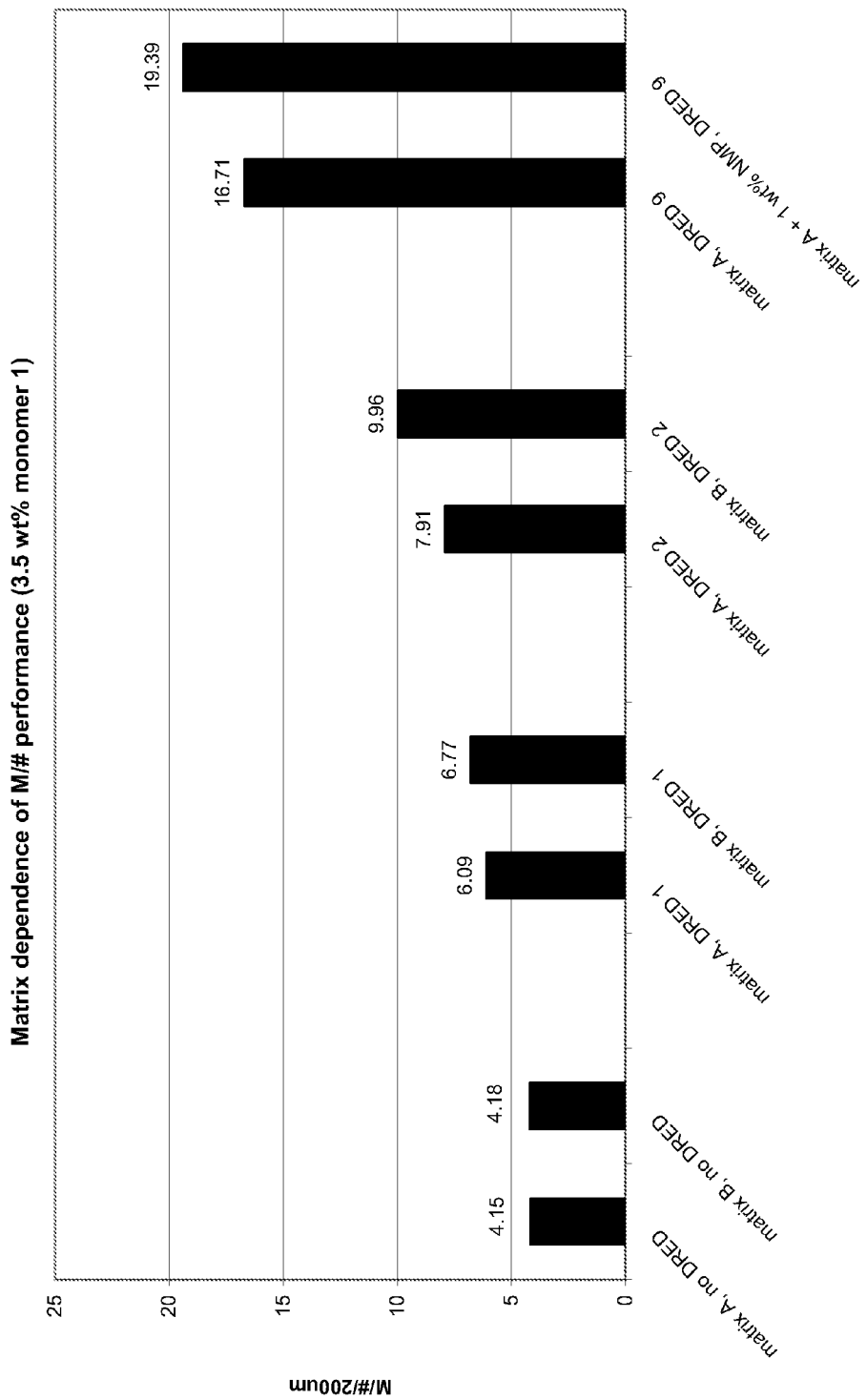
FIG. 4 is a graph showing the matrix dependence of M/#/200 μm for photopolymer media formulations of the present invention and showing the effect of adding a plasticizer to one of the photopolymer media formulations.

Also, changes in the composition of the support matrix which, in the absence of DRED compounds, have no effect on M/#, may unexpectedly lead to considerable differences in dynamic range performance in the presence of DRED compounds, as shown in FIG. 4.

Figure 5:
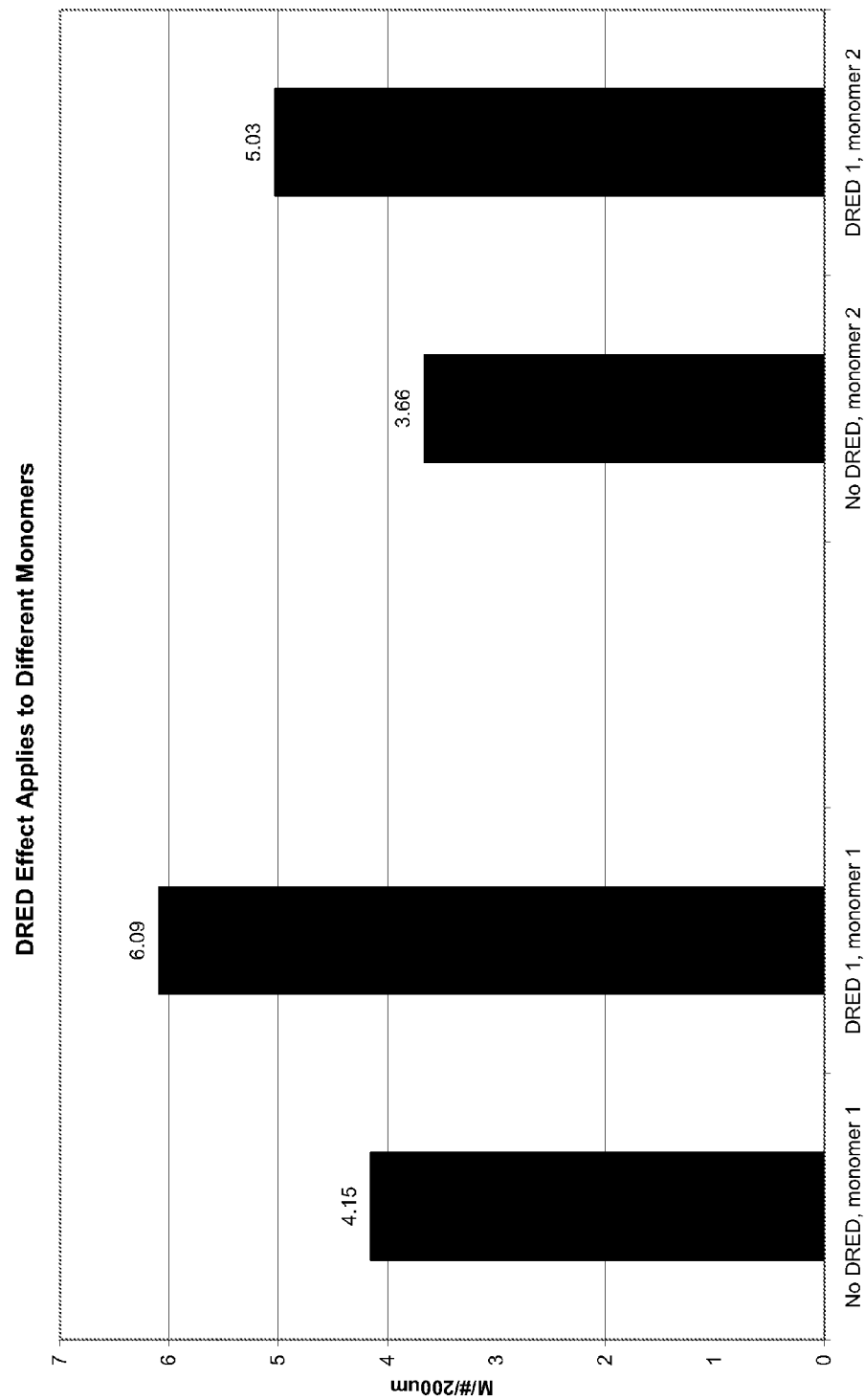
FIG. 5 is a graph showing the effect of a dynamic range enhancing dopant on different monomers in photopolymer media formulations of the present invention.

FIG. 5 shows that the effect of DRED compounds applies to different monomers including monomers with a single reactive functional group and monomers with multiple reactive functional groups.

Figure 6:
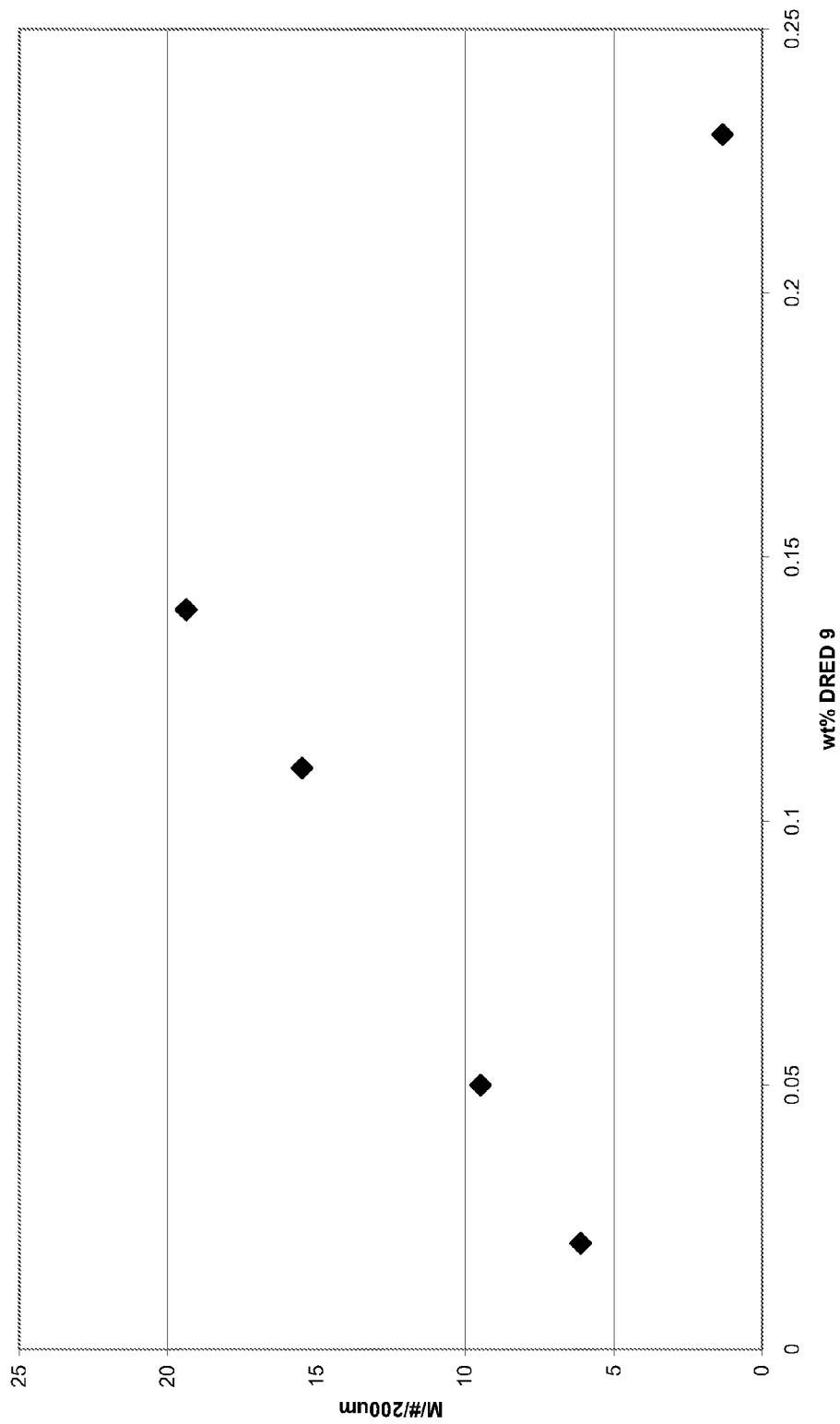
FIG. 6 is a graph showing M/#/200 μm for photopolymer media formulations of the present invention comprising a plasticizer and different concentrations of a dynamic range enhancing dopant compound of the present invention.

FIG. 6 shows the very large dynamic range increase due to using DRED 9 and a plasticizer, N-Methyl-2-pyrrolidone (NMP), in an optical article of the present invention.

Figure 7:
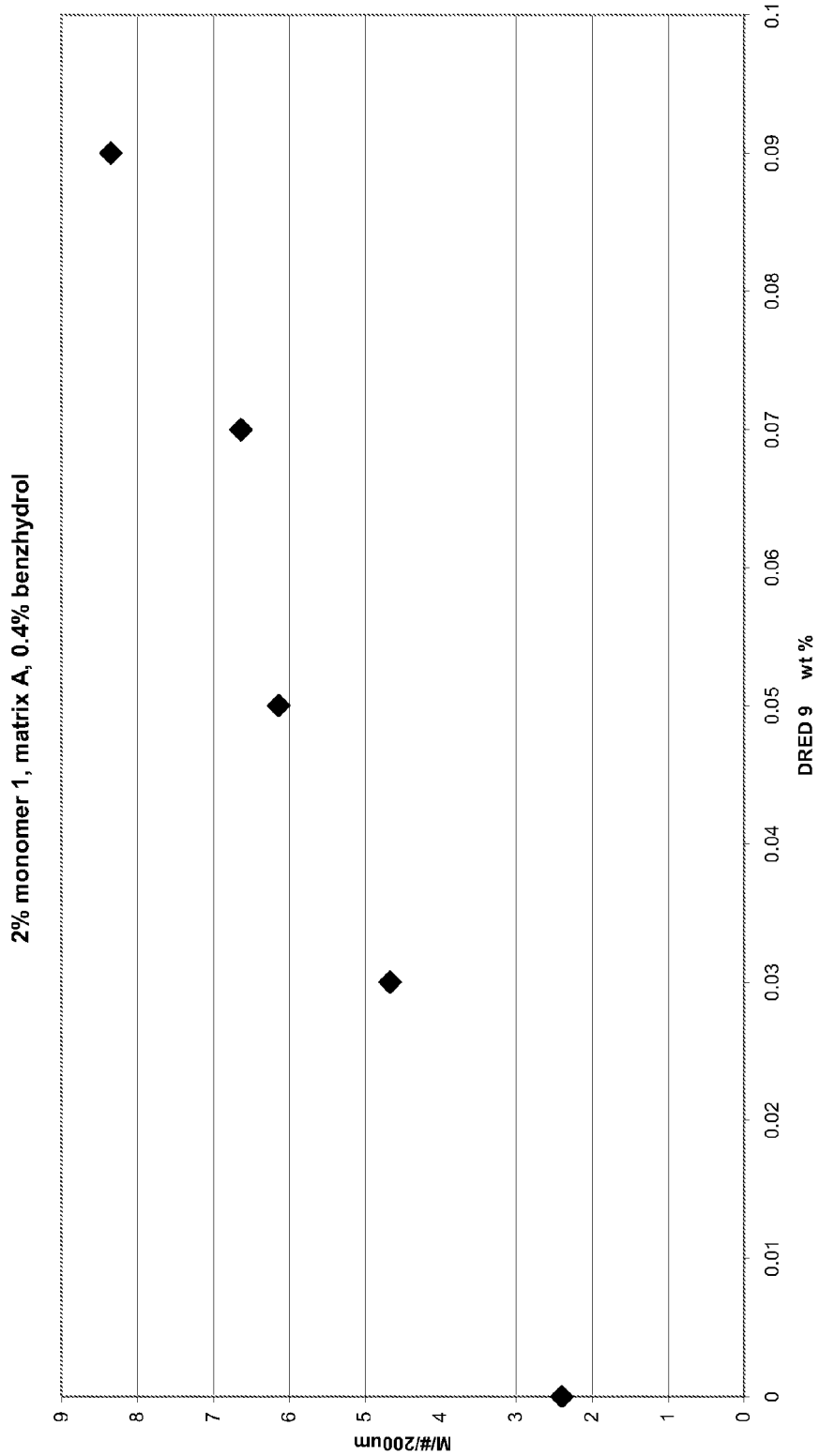
FIG. 7 is a graph showing M/#/200 μm for photopolymer media formulations of the present invention comprising benzhydrol and different concentrations of a dynamic range enhancing dopant compound of the present invention.

FIG. 7 shows that the effect of DRED compounds applies to articles which contain the polymerization retarder benzhydrol.

Figure 8:
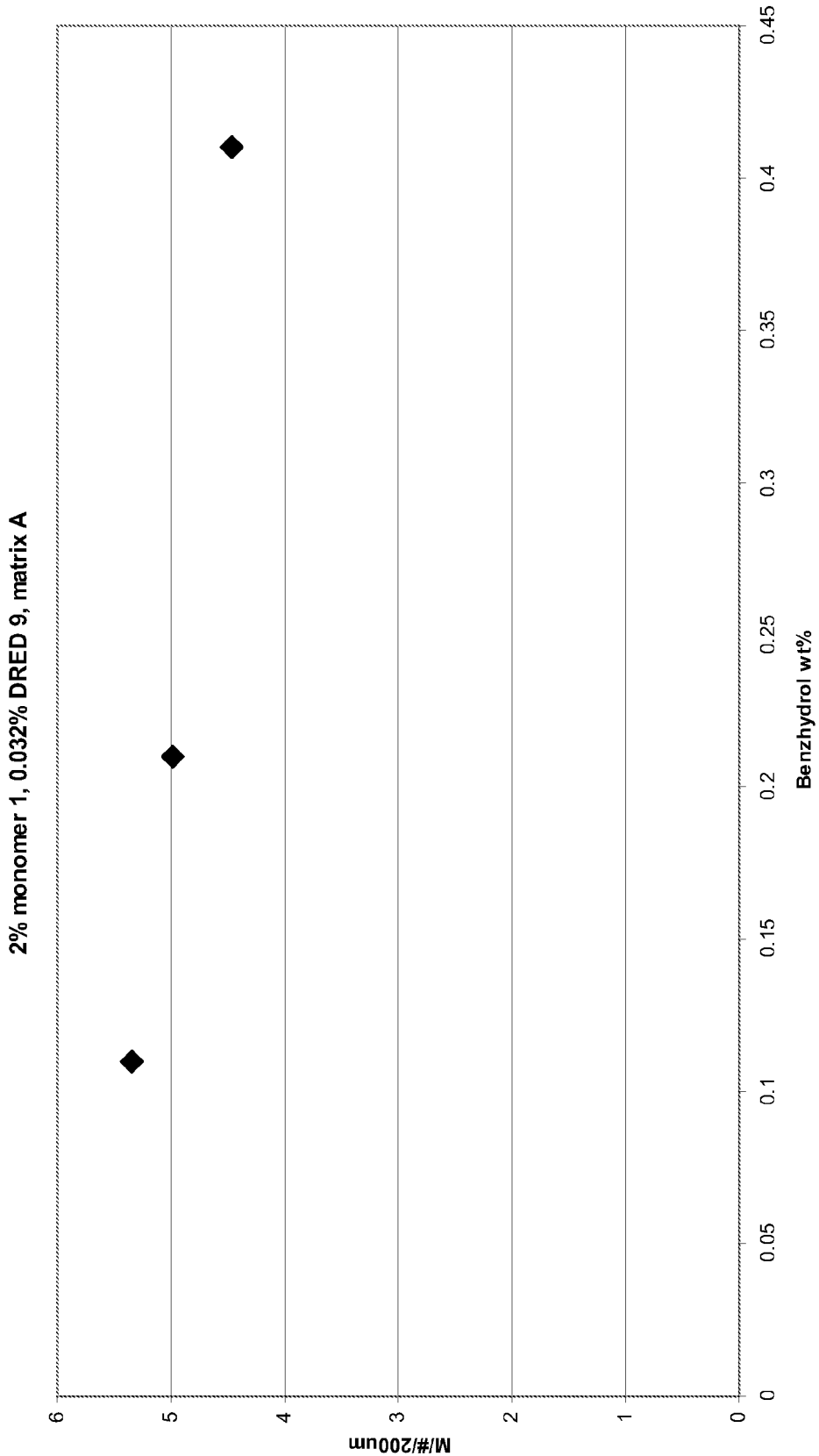
FIG. 8 is a graph showing the M/#/200 μm for photopolymer media formulations of the present invention comprising a dynamic range enhancing dopant compound of the present invention and different concentrations of benzhydrol.

FIG. 8 shows that the concentration of polymerization retarder in the article can affect the M/# performance measured in DRED containing articles.

Figure 9:
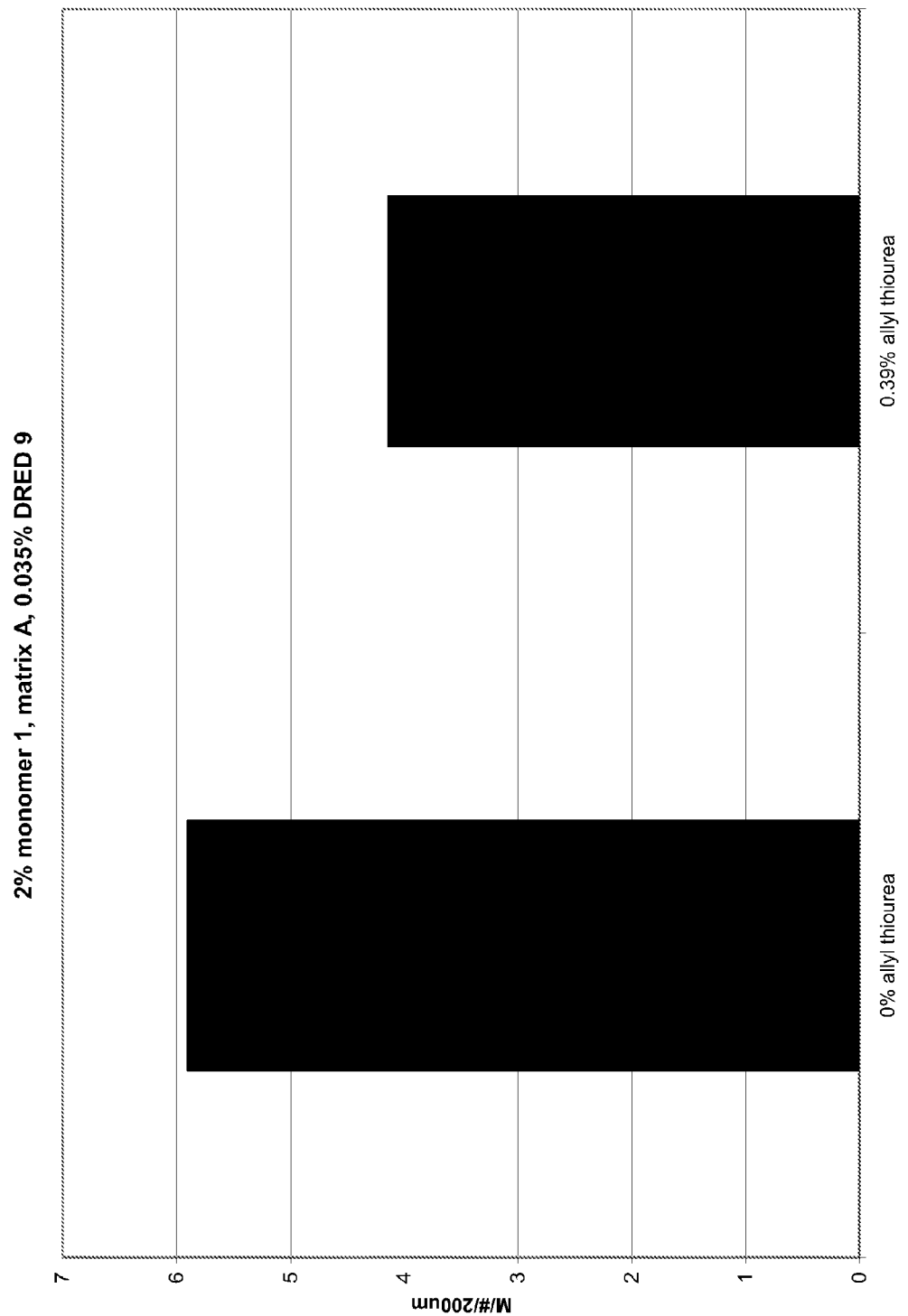
FIG. 9 is a graph showing the M/#/200 μm for photopolymer media formulations of the present invention comprising a dynamic range enhancing dopant compound of the present invention and with and without allyl thiourea.

FIG. 9 shows that other polymerization retarders have the same type of effect on M/# performance as benzhydrol does when added to articles containing DRED compounds.

Figure 3:
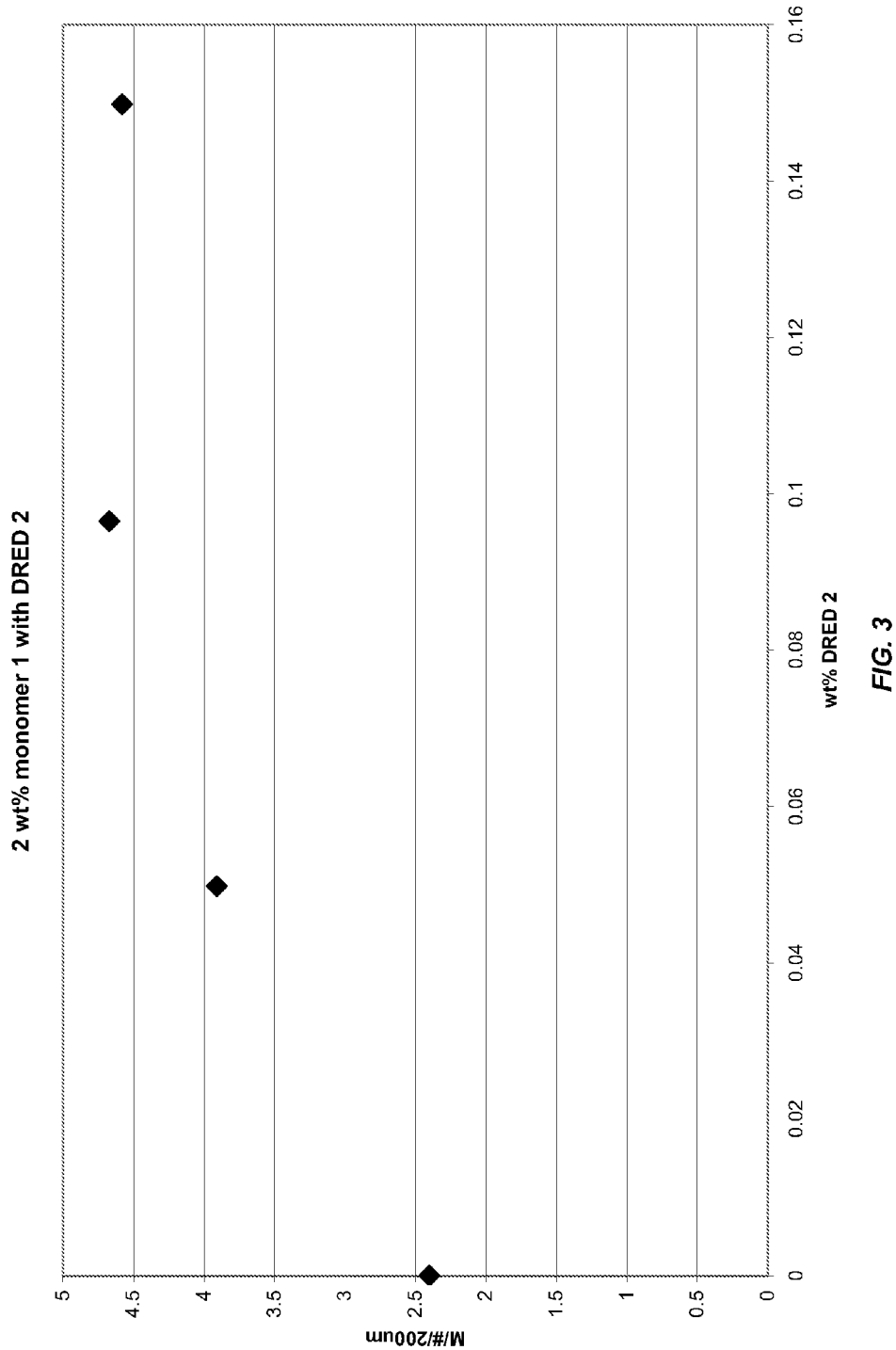
FIG. 3 is a graph showing M/#/200 μm for photopolymer media formulations including different concentrations of the dynamic range enhancing dopant compound in which the monomer comprises 2 wt % of each formulation.

The optimum wt % of a DRED compound in a formulation generally increases with increasing monomer wt %. However, as shown in FIGS. 2, 3 and 6, for a given monomer wt %, there is an optimum DRED wt % where the effect of the DRED on the dynamic range of a formulation is at a maximum. Increasing the amount of DRED beyond this optimum DRED wt % results in a reduction in the effect of the DRED on the dynamic range of the formulation.

In one embodiment of the present invention, an optical article including a DRED compound of the present invention has a dynamic range that is at least about 1.1 times the value of the dynamic range of the same article without the dynamic range enhancing dopant.

In one embodiment of the present invention, an optical article including a DRED compound of the present invention has a dynamic range that is about 1.3 times or more the value of the dynamic range of the same article without the dynamic range enhancing dopant. In one embodiment of the present invention, an optical article including a DRED compound of the present invention has a dynamic range that is about 1.5 times or more the value of the dynamic range of the same article without the dynamic range enhancing dopant. In one embodiment of the present invention, an optical article including a DRED compound of the present invention has a dynamic range that is about 2 times or more the value of the dynamic range of the same article without the dynamic range enhancing dopant. In one embodiment of the present invention, an optical article including a DRED compound of the present invention has a dynamic range that is about 3 times or more the value of the dynamic range of the same article without the dynamic range enhancing dopant. In one embodiment of the present invention, an optical article including a DRED compound of the present invention has a dynamic range that is about 4 times or more the value of the dynamic range of the same article without the dynamic range enhancing dopant.

In one embodiment of the present invention, a DRED compound of the present invention comprises about 0.01 wt % to about 1.5 wt % of an optical article. In one embodiment of the present invention, a DRED compound of the present invention comprises about 0.03 wt % to about 1.0 wt % of an optical article. In one embodiment of the present invention, a DRED compound of the present invention comprises about 0.04 wt % to about 0.35 wt % of an optical article.

DRED compounds do not produce viable media in the absence of monomers indicating that they do not function simply as "super-effective" monomers. DRED compounds also do not operate by increasing the extent of monomer reactive functional group converted into polymer as evidenced by the physical shrinkage being substantially unchanged.

DRED compounds of the present invention include two functional groups that allow the compounds to operate successfully. One functional group is a radical trap group to which a growing polymer chain, formed from monomers during data recording to a holographic storage medium, can add, thereby covalently attaching the polymer chain to the DRED compound. Substituted styrenes, such as 1,1-diphenylethylene derivatives, such as DRED 1, DRED 2, DRED 3, DRED 4, DRED 6 and DRED 8 are examples of such DRED compounds. A DRED compound also includes an immobilizing group that allows the DRED compound to be covalently attached to the support matrix. One example of such a group is a hydroxyl group which reacts with an isocyanate group during the formation of the polyurethane support matrix. DRED 1, DRED 2, DRED 3, DRED 4, DRED 5, DRED 8, DRED 9, DRED 10, DRED 11 and DRED 12 include such a hydroxyl group. It is well established in the literature that a primary or secondary amine group would also constitute an effective immobilizing group by reacting with the isocyanate to produce a urea during matrix formation. Other DRED compounds, such as DRED 6, may include a carboxylic acid group as an immobilizing group. Yet other DRED compounds, such as DRED 7 and DRED 13, may include an isocyanate group as an immobilizing group which reacts with a hydroxyl group during the formation of the polyurethane support matrix.

In one embodiment of the present invention, DRED 1, DRED 2, DRED 3, DRED 4, DRED 5 and DRED 6 may be synthesized by the following steps (i), (ii), (iii) and (iv):

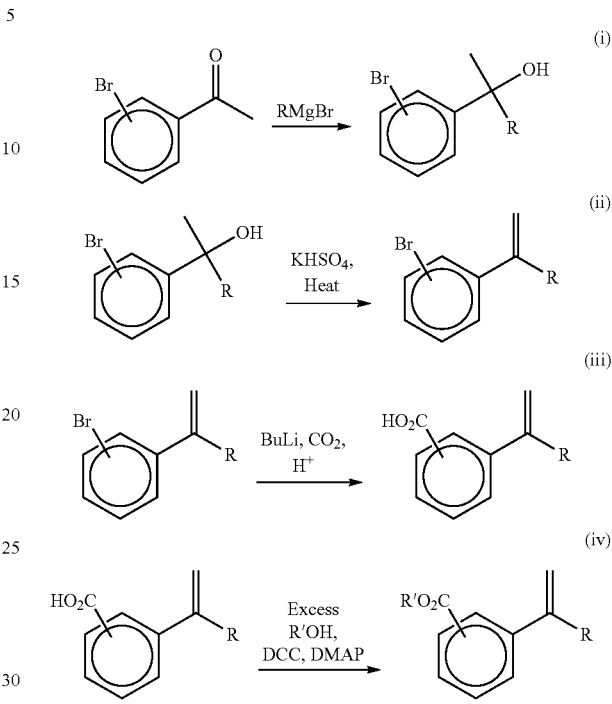

wherein:
for DRED 1: R=Ph and 2-R'=CH$_2$CH$_2$OH;
for DRED 2: R=Ph and 4-R'=CH$_2$CH$_2$OH;
for DRED 3: R=Ph and 3-R'=CH$_2$CH$_2$OH;
for DRED 4: R=3,5-(CF$_3$)$_2$Ph and 4-R'=CH$_2$CH$_2$OH;
for DRED 5: R=Me and 4-R'=CH$_2$CH$_2$OH; and
for DRED 6: R=Ph and 2-R'=H. and is obtained as the product of (iii).

In one embodiment of the present invention, DRED 8 may be synthesized by steps (i), (ii) and (iii) above followed by step (v) shown below:

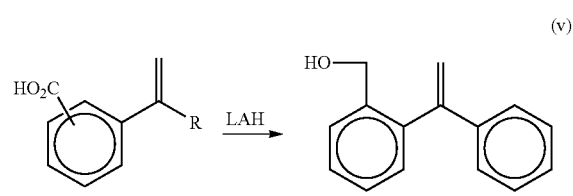

wherein R=Ph.

In one embodiment of the present invention, DRED 10 may be synthesized by the following steps (ia), (iia), (iiia) and (iva):

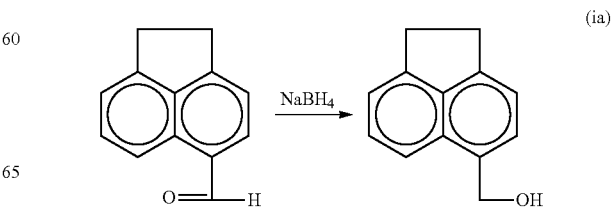

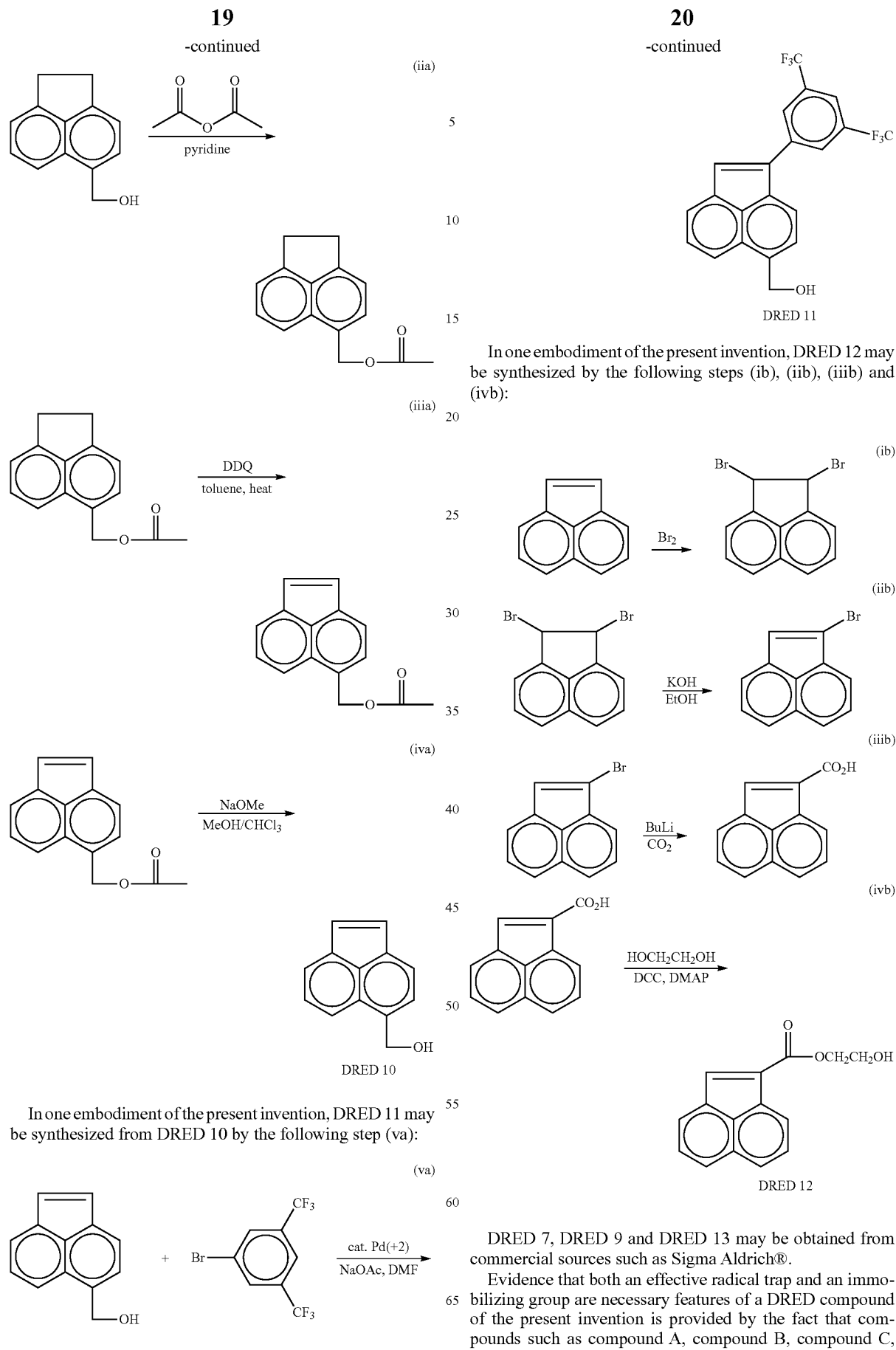

In one embodiment of the present invention, DRED 11 may be synthesized from DRED 10 by the following step (va):

In one embodiment of the present invention, DRED 12 may be synthesized by the following steps (ib), (iib), (iiib) and (ivb):

DRED 7, DRED 9 and DRED 13 may be obtained from commercial sources such as Sigma Aldrich®.

Evidence that both an effective radical trap and an immobilizing group are necessary features of a DRED compound of the present invention is provided by the fact that compounds such as compound A, compound B, compound C, compound D, compound E, compound F, compound G and compound H shown below do not show enhancement of M/# when included as formulation components.

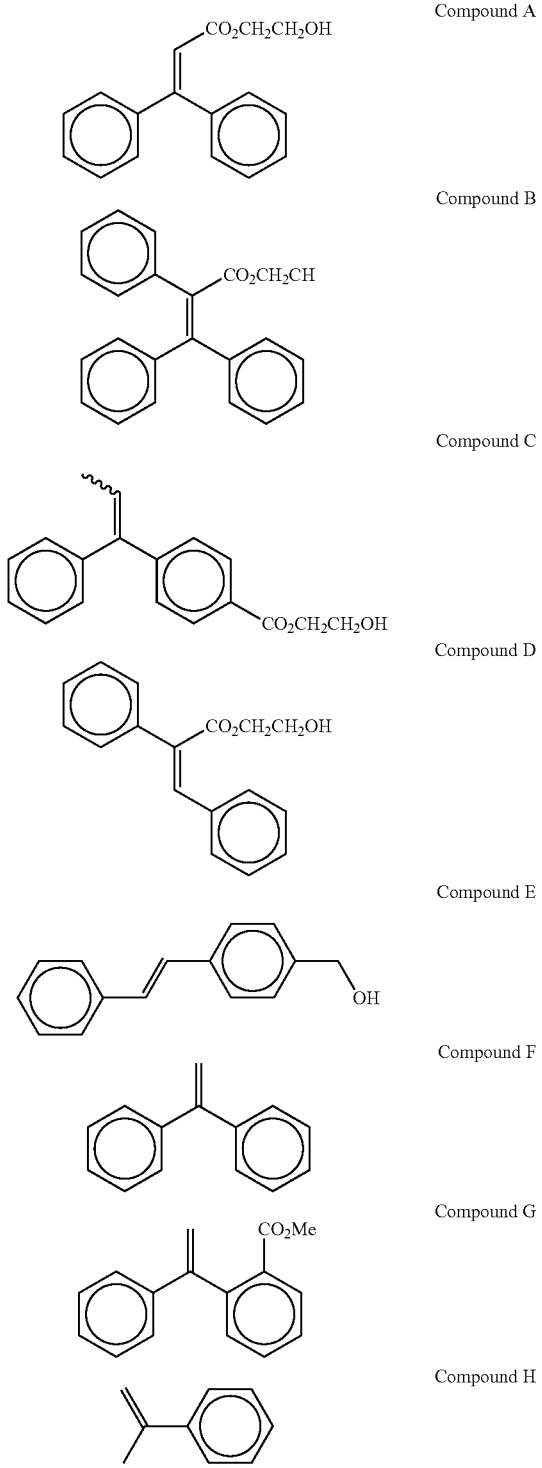

Compound A

Compound B

Compound C

Compound D

Compound E

Compound F

Compound G

Compound H

Compounds A, B, C, D, and E have structures similar to one or more of DRED 1, DRED 2, DRED 3, DRED 4, DRED 5, DRED 6, DRED 7, DRED 8, DRED 10, DRED 11 and DRED 12. These compounds all contain immobilizing groups but do not include an effective radical trap group. Steric hindrance around the alkene diminishes their reactivity toward the growing polymer chain to the point that they cannot function. Compounds F, G and H have structures similar to one or more of DRED 1, DRED 2, DRED 3, DRED 4, DRED 5, DRED 6, DRED 7, DRED 8, DRED 10, DRED 11 and DRED 12, and contain effective radical trap groups but these compounds do not include an immobilizing group. Thus, it is demonstrated that both functions, namely, effective radical trapping and effective immobilization, must be present in a DRED. DRED 9, whose radical trapping ability is provided by the presence of an aminoxyl group, and DRED 13, whose radical trapping ability is provided by the presence of a nitro group, clearly demonstrate that the radical trapping function can be fulfilled by groups other than alkenes which are known to have high reactivity with respect to bond formation to radicals. Other choices for this group, such as nitrones, will be obvious to those skilled in the art.

The DRED compounds of the present invention provide significant enhancements in the dynamic range of photopolymer based media appropriate for a range of applications, including holographic data storage. This effect also occurs without a corresponding increase in the recording induced physical shrinkage of the material.

In one embodiment, the addition of a DRED compound of the present invention may increase the dynamic range of a photopolymer based medium to a value that is at least 1.1 times or more the value obtained for the photopolymer based medium without the DRED compound. In one embodiment, the addition of a DRED compound of the present invention may increase the dynamic range of a photopolymer based medium to a value that is about 1.5 times or more the value obtained for the photopolymer based medium without the DRED compound. In one embodiment, the addition of a DRED compound of the present invention may increase the dynamic range of a photopolymer based medium to a value that is about 2 times or more the value obtained for the photopolymer based medium without the DRED compound. In one embodiment, the addition of a DRED compound of the present invention may increase the dynamic range of a photopolymer based medium to a value that is about 3 times or more the value obtained for the photopolymer based medium without the DRED compound. In one embodiment, the addition of a DRED compound of the present invention may increase the dynamic range of a photopolymer based medium to a value that is about 4 times or more the value obtained for the photopolymer based medium without the DRED compound.

The DRED compounds of the present invention may be used with a variety of formulations for making photopolymerizable recording materials, such as the photopolymerizable recording material formulations described in U.S. patent application Ser. No. 12/099,967, entitled "Advantageous Recording Media for Holographic Applications" to Stoeckel et al. published Jul. 23, 2009 as U.S. Published Application No. 2009/0185470, and the entire contents and disclosure of this application is incorporated by reference. In some cases, it may be desirable to slightly modify photopolymerizable recording material formulations when the DRED compounds of the present invention are used with these formulations.

Embodiments of the holographic storage media of the present invention may be formed such that holographic writing to and reading from the medium are possible. Fabrication of the holographic storage medium may involve depositing a combination, blend, mixture, etc., of the support matrix, photoactive polymerizable material, photoinitiator, DRED, etc., on a support structure, such as a substrate, or more typically positioned between a pair of (i.e., two) substrates, and using, for example, a gasket to contain the mixture. Spacers may also be used between the substrates to maintain a desired thickness for the recording medium. In applications requiring optical flatness, the liquid mixture may shrink during cooling (if a thermoplastic) or curing (if a thermoset) and thus distort the optical flatness of the article. To reduce such effects, it may be useful to place the holographic storage medium between substrates in an apparatus containing mounts, e.g., vacuum chucks, capable of being adjusted in response to changes in parallelism and/or spacing. In such an apparatus, it may be possible to monitor the parallelism in real-time by use of conventional interferometric methods, and to make any necessary adjustments to the heating/cooling process. During formation, the holographic storage medium may be supported in other ways other than by use of a substrate or substrates. More conventional polymer processing is also envisioned, e.g., closed mold formation, sheet extrusion, etc. A stratified article is also contemplated, i.e., a plurality of holographic storage medium layers disposed between respective substrates.

Embodiments of the holographic recording media of the present invention that are formed may be capable of being used in a holographic storage system, for example, the one shown in FIG. 1 and described in commonly assigned U.S. Pat. No. 6,482,551 (Dhar, et al.), issued Nov. 19, 2002, the entire disclosure and contents of which is incorporated herein by references. The amount of information capable of being stored in a holographic storage medium is proportional to the product of: the refractive index contrast, $\Delta n$, of the photorecording material the thickness, d, of the photorecording material, etc. The $\Delta n$ is associated with a medium before writing, but may be observed by a measurement performed after recording. Advantageously, embodiments of the holographic storage media of the present invention exhibit a $\Delta n$ of about $3 \times 10^{-3}$ or higher.

In addition to holographic storage media, examples of embodiments of other optical articles of the present invention may include beam or optical filters, beam steerers or deflectors, optical couplers, etc. (See, e.g., L. Solymar et al., *Volume Holography and Volume Gratings*, (Academic Press 1981), pp.: 315-27), the entire contents and disclosure of which is incorporated herein by reference.) A beam filter separates part of an incident laser beam that is traveling along a particular angle from the rest of the beam. Specifically, the Bragg selectivity of a thick transmission hologram is able to selectively diffract light along a particular angle of incidence, while light along other angles travels undeflected through the hologram. (See, e.g., J. E. Ludman et al., "Very thick holographic non-spatial filtering of laser beams," *Optical Engineering*, 36, (6), (1997), pp.: 1700 et seq., the entire contents and disclosure of which is incorporated herein by reference.) A beam steerer is a hologram that deflects light incident at the Bragg angle. An optical coupler may be a combination of beam deflectors that steer light from a source to a target. These articles, which may also be referred to as holographic optical elements, may be fabricated by imaging a particular optical interference pattern within a recording medium, as discussed herein. Media for these holographic optical elements may be formed by the techniques discussed herein for recording media or waveguides. The material principles discussed herein are applicable not only to hologram formation, but also to formation of optical transmission devices such as waveguides.

Polymeric optical waveguides are discussed for example in B. Booth, "Optical Interconnection Polymers," in *Polymers for Lightwave and Integrated Optics, Technology and Applications*, (L. A. Hornak, ed., Marcel Dekker, Inc. 1992); U.S. Pat. No. 5,292,620 (Booth et al.), issued Mar. 18, 1994; and U.S. Pat. No. 5,219,710 (Horn et al.), issued Jun. 15, 1993, the disclosures of which are incorporated herein by reference. Essentially, the recording material may be irradiated in a desired waveguide pattern to provide refractive index contrast between the waveguide pattern and the surrounding (cladding) material. It may also be possible for exposure to be performed, for example, by a focused laser light, by use of a mask with a non-focused light source, etc. Generally, a single layer may be exposed in this manner to provide the waveguide pattern, and additional layers may be added to complete the cladding, thereby completing the waveguide. This process is discussed for example at pages 235-36 of Booth, supra, and Cols. 5 and 6 of U.S. Pat. No. 5,292,620, supra, the entire contents and disclosure of which is incorporated herein by reference.

The support matrix of the holographic storage medium may make up as much as about 5%, preferably as much as about 50%, and more preferably as much as about 90% of the holographic storage medium by volume. The amount of any given support matrix in the holographic storage medium may vary based on clarity, refractive index, melting temperature, $T_g$, color, birefringence, solubility, etc. of the thermoplastic or thermoplastics that make up the binder component. Additionally, the amount of the support matrix in the holographic storage medium may vary based on the article's final form, whether it is a solid, a flexible film, or an adhesive.

Suitable thermoset systems for used herein are disclosed in to U.S. Pat. No. 6,482,551 (Dhar et al.), issued Nov. 19, 2002, the entire disclosure and contents of which is incorporated herein by reference.

In another embodiment, the holographic storage medium may comprise at least one photoactive polymerizable material that can form holograms in the resulting photopolymer when exposed to a photoinitiating light source, such as a laser beam that is recording data pages to the holographic storage medium. The photoactive polymerizable materials may include any photoactive monomer, photoactive oligomer, or combination thereof, having the parameters as further described below, that is capable of undergoing photoinitiated polymerization, and which, in combination with the support matrix and DRED, meets the compatibility requirements of the present invention. Suitable photoactive polymerizable materials may include those which polymerize by a free-radical reaction, e.g., molecules containing ethylenic unsaturation (i.e., one or more double bonds), such as acrylates, methacrylates, acrylamides, methacrylamides, styrenes, substituted styrenes, such as methyl styrene, etc., vinyl naphthalenes, substituted vinyl naphthalenes, other vinyl polyaromatics, vinylcyclohexene, vinylcyclohexene dioxide, vinylcyclohexene monoxide, vinyl esters, vinyl ethers, vinyl carbazoles, other vinyl derivatives, cycloalkenes, cyclic ethers (e.g., epoxide, glycidyl ether, allyl glycidyl ether, etc.), cyclic carbonates, cyclic esters, dioxalanes, etc. It may also be possible for a single photoactive polymerizable molecule to contain more than one polymerizable functional group. Photoactive oligomers that may be included in the photoactive polymerizable materials to form a holographic grating upon exposure to a photoinitiating light source include oligomers such as oligomeric (ethylene sulfide) dithiol, oligomeric (phenylene sulfide) dithiol, oligomeric (bisphenol A), oligomeric (bisphenol A) diacrylate, oligomeric polyethylene with pendent vinyl ether groups, etc. The photoactive polymerizable material of the holographic storage medium may be monofunctional, difunctional, and/or multifunctional.

In addition to the at least one photoactive polymerizable material, the article comprising the holographic storage medium may contain a photoinitiator. The photoinitiator, upon exposure to relatively low levels of the recording light, chemically initiates the polymerization of the photoactive polymerizable material, thus avoiding the need for direct light-induced polymerization. The photoinitiator generally should offer a source of species that initiate polymerization of the particular photoactive polymerizable material, e.g., photoactive monomer. Typically, from about 0.1 to about 20 vol. % photoinitiator provides desirable results. A variety of photoinitiators known to those skilled in the art and available commercially are suitable for use in the holographic storage medium. It may be advantageous to use a photoinitiator that is sensitive to light at wavelengths available from conventional laser sources, e.g., the blue and green lines of Ar+(458, 488, 514 nm) and He—Cd lasers (442 nm), the green line of frequency doubled YAG lasers (532 nm), and the red lines of He—Ne (633 nm), Kr+lasers (647 and 676 nm), and various diode lasers (290 to 900 nm). One advantageous free radical photoinitiator is bis($\eta$-5-2,4-cyclopentadien-1-yl)bis[2,6-difluoro-3-(1H-pyrrol-1-yl)phenyl]titanium, available commercially from Ciba as Irgacure 784™. Another visible free-radical photoinitiator (which requires a co-initiator) is 5,7-diiodo-3-butoxy-6-fluorone, commercially available from Spectra Group Limited as H-Nu 470. Free-radical photoinitiators of dye-hydrogen donor systems are also possible. Examples of suitable dyes include eosin, rose bengal, erythrosine, and methylene blue, and suitable hydrogen donors include tertiary amines such as n-methyl diethanol amine. For blue wavelengths, any of the photoinitiators described in U.S. Pat. No. 6,780,546 (Trentler et al.), issued Aug. 24, 2004, the entire disclosure and contents of which is incorporated herein by reference, may be useful.

In many embodiments of the holographic storage medium, the photoinitiators used are sensitive to ultraviolet and visible radiation of from about 200 nm to about 1000 nm.

An optical article of the present invention may also include additives such as plasticizers for altering the properties thereof including the melting point, flexibility; toughness, diffusibility of the monomers, ease of processibililty, etc. Examples of suitable plasticizers include dibutyl phthalate, poly (ethylene oxide) methyl ether, N,N-dimethylformamide, etc. Plasticizers differ from solvents in that solvents are typically evaporated whereas plasticizers are meant to remain in the holographic storage medium.

An optical article of the present invention may also include retarders/free radical stabilizers. Examples of retarders are the free radical stabilizers, inhibitors and antioxidants described in Methoden der organischen Chemie [Methods of Organic Chemistry], (Houben-Weyl), 4th Edition, Volume XIV/1, page 433ff, Georg Thieme Verlag, Stuttgart 1961, Suitable classes of substances are, for example, phenols, such as for example 2,6-di-tert-butyl-4-methylphenol, cresols, hydroquinones, benzyl alcohols, such as, for example, benzhydrol, optionally also quinones, such as, for example, 2,5-di-tert-butylquinone, optionally also aromatic amines, such as diisopropylamine or phenothiazine.

Another example of a retarder that may be used in optical articles of the present invention is allyl thiourea.

Other types of additives that may be used in the liquid mixture of the holographic storage medium are inert diffusing agents having relatively high or low refractive indices. Inert diffusing agents typically diffuse away from the hologram being formed, and can be of high or low refractive index but are typically low. Thus, when the photoactive polymerizable material is of high refractive index, the inert diffusing agent would be of low refractive index, and ideally the inert diffusing agent diffuses to the nulls in an interference pattern. Overall, the contrast of the hologram may be increased. Other additives that may be used in the mixture comprising the holographic storage medium include: pigments, fillers, non-photoinitiating dyes, antioxidants, bleaching agents, mold releasing agents, antifoaming agents, infrared/microwave absorbers, surfactants, adhesion promoters, etc.

In one embodiment of the holographic storage medium, the photoactive polymerizable material comprises less than about 20 volume %. In other embodiments, the photoactive polymerizable material of the holographic storage medium may be less than about 10 volume %, or even less than about 5 volume %. For data storage applications, the photoactive polymerizable material is typically present at about 5 volume %. Factors affecting the amount of polymerizable content needed are generally the desired index contrast and effects from shrinkage of the photoactive polymerizable material upon recording (if it occurs), and so may be selected based on the particular application.

An optical article of the present invention may be of any thickness needed. For example the article may be thin for display holography or thick for data storage. For data storage applications, the article may be, for example, from about 1 to about 1.5 mm in thickness, and may be in the form of a film or sheet of holographic storage medium between two substrates with at least one of the substrates having an antireflective coating and may be sealed against moisture and air. An article of the present invention may also be made optically flat via the appropriate processes, such as the process described in U.S. Pat. No. 5,932,045 (Campbell et al.), issued Aug. 3, 1999, the entire disclosure and contents of which is incorporated herein by reference.

An optical article of the present invention may be used for decorative purposes. For example, the article may be used in gift wrap or in window treatments to provide special artistic tinting or 3D designs. The article may be used in molded parts of automobiles, toys, furniture, appliances, etc. to provide decorative effects. An article of the present invention may also be used to make data storage devices of various sizes and shapes, as a block of material or as part of a coating that is coated on a substrate. Embodiments of the holographic storage media and articles of the present invention may be used in various methods for recording one or more holograms (i.e., at least one hologram), including any method known to those skilled in the art for recording holograms in other holographic storage media. An embodiment of a method for recording at least one hologram may comprise the following steps: (a) providing an article comprising the holographic storage medium (with or without a photoinitiator for the photoactive polymerizable material); and (b) exposing the article to a photoinitiating light source (e.g., recording light) to cause the photoactive polymerizable material (e.g., by activating any photoinitiator present in the article) to form a photopolymer to thereby record at least one hologram in the holographic medium. Embodiments of methods of the present invention for recording holograms may include, for example, multiplexing holograms (e.g., polytopic, angular, phase shift, varying wavelength, varying phase code, phase correlation, etc.), as well as other techniques for recording of holograms in holographic media known to those skilled in the art. Some suitable methods for recording holograms, including multiplexing techniques, are disclosed in, for example, U.S. Pat. No. 5,703,705 (Curtis et al.), issued Dec. 30, 1997; U.S. Pat. No. 5,719,691 (Curtis et al.), issued Feb. 17, 1998; U.S. Pat. No. 5,892,601 (Curtis et al.), issued Apr. 6, 1999; U.S. Pat. No. 5,943,145 (Curtis et al.), issued Aug. 24, 1999; U.S. Pat. No. 6,191,875 (Curtis et al.), issued Feb. 20, 2001; U.S. Pat. No. 6,614,566 (Curtis et al.), issued Sep. 2, 2003; commonly assigned U.S. Pat. No. 6,697,180 to Wilson et al.), issued Feb. 24, 2004; U.S. Pat. No. 6,798,547 (Wilson et al.), issued Sep. 28, 2004; U.S. Pat. No. 6,721,076 (King et al.), issued Apr. 13, 2004; and U.S. Published Patent Application No. 2004-0179251 Anderson, et al.), published Sep. 16, 2004, the entire disclosure and contents of which are incorporated herein by reference.

In one embodiment, the photoactive monomer used in forming an article of the present invention is a photoactive monomer including two acrylate groups. One example of a photoactive monomer with two acrylate groups that may be used in formulations of the present invention is monomer 1, which has the following structural formula:

Monomer 1

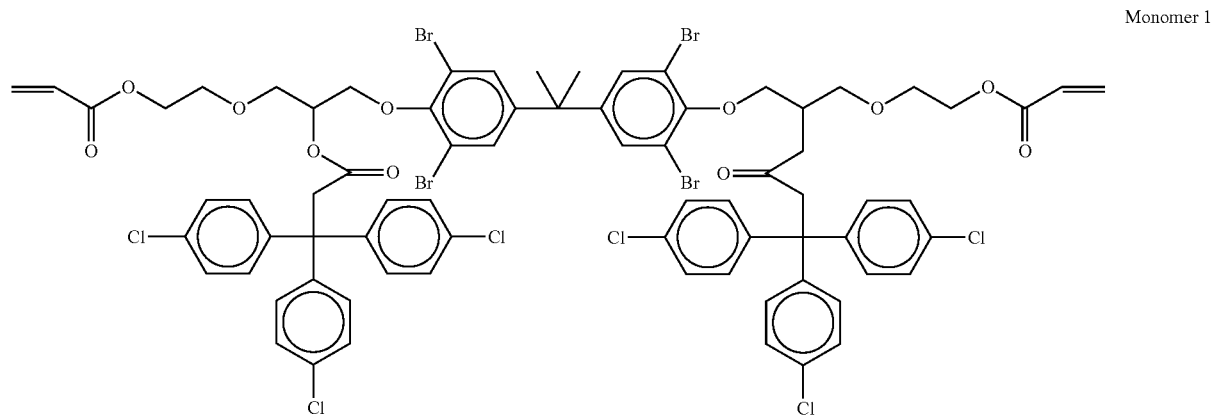

In one embodiment, the photoactive monomer used in forming an article of the present invention is a photoactive monomer including one acrylate group. One example of a photoactive monomer with one acrylate group that may be used in formulations of the present invention is monomer 2, which has the following structural formula:

Monomer 2

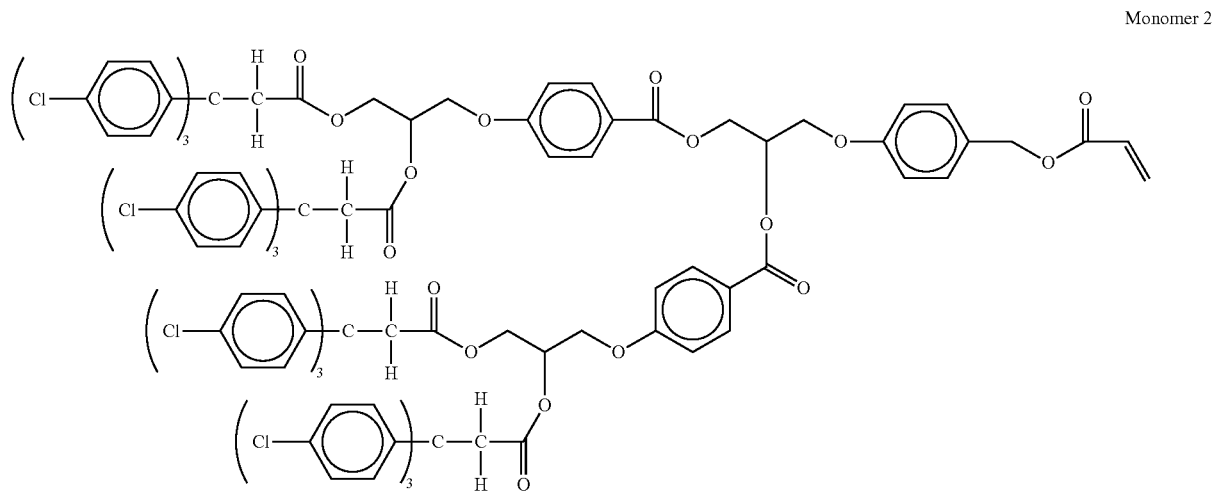

Embodiments of the polymer matrix of the present invention contain components containing isocyanate, NCO, groups and may contain components containing polyol, OH, groups. These components may provide compatibility with the photoactive monomers and speed and ease in manufacturing of the optical article. The performance of embodiments of the photoactive polymerizable materials of the present invention in, for example, index contrast applications such as holographic data storage (e.g., hologram recording), holographic optical elements, waveguides, photolithography, etc., may be improved by maintaining the equivalent ratio of the hydroxyl functionality of the polyol component to the isocyanate functionality of the NCO component within 0.5 to 1.5.

Embodiments of the photoinitiator of the present invention may contain photoinitiators comprising an acylphosphine oxide or an oxime ester or combinations thereof. The performance of embodiments of the photoactive polymerizable materials of the present invention in, for example, index contrast applications such as holographic data storage (e.g., hologram recording), holographic optical elements, waveguides, photolithography, etc., may be improved wherein the organic photoinitiator is selected from the group consisting of photoiniators 1, 2, 3 and 4 show below and combinations thereof:

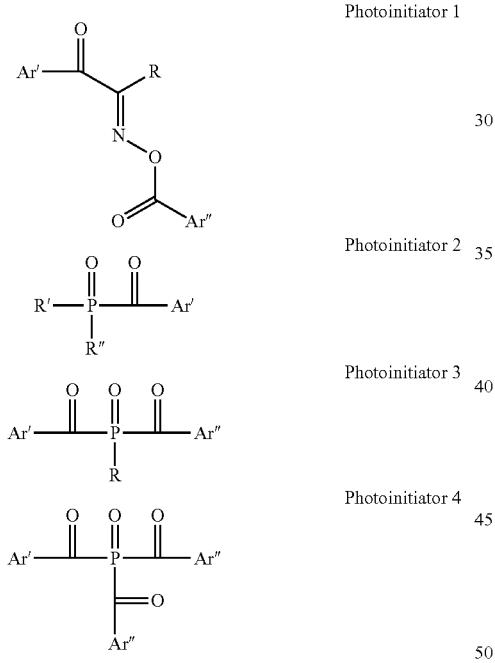

Photoinitiator 1

Photoinitiator 2

Photoinitiator 3

Photoinitiator 4

Embodiments of the polymer matrix of the present invention may contain free radical retarders and/or plasticizers to improve performance. Having described the many embodiments of the present invention in detail, it will be apparent that modifications and variations are possible without departing from the scope of the invention defined in the appended claims. Furthermore, it should be appreciated that all examples in the present disclosure, while illustrating many embodiments of the invention, are provided as non-limiting examples and are, therefore, not to be taken as limiting the various aspects so illustrated.

EXAMPLES

Methods of making materials used in the examples below are described in U.S. Patent Application Publication No. 2009/0185470 (Stoeckel et al.), published Jul. 23, 2009, the entire disclosure and contents of which is incorporated herein by reference. These materials include:

Darocur TPO is 2,4,6-trimethyl-benzoyl-diphenylphosphinoxide, available from Ciba Speciality Chemicals. All of the formulations in the examples below contain 0.2 wt % Darocur TPO as photoinitiator.

Desmodur XP2410 is a hexanediisocyanate-1,6 based polyisocyanate with an NCO content of 23.5%, containing a high content of oxadiazinedione structures, available from Bayer Material ScienceAG, Leverkusen, Germany.

Blockcopolymer 1 is made by the following method: A 1 liter three neck flask was charged with 0.25 g stannous octoate, 172.29 g~caprolactone and 327.46 g of a difunctional polytetrahydrofuranpolyetherpolyols (Equivalent weight 325 g/Mol OH) and heated to 120° C. The temperature is kept until the solids content was above 99.5 wt.-%. After cooling a viscous product is obtained.

Blockcopolymer 2 is made by the following method: A 1 liter three neck flask is charged with 0.18 g stannous octoate, 374.81 g~caprolacton and 374.81 g of a difunctional Polytetrahydrofuranpolyetherpolyols (Equivalentweight 500 g/Mol OH) and heated to 120° C. The temperature is kept until the solids content was above 99.5 wt.-%. After cooling a waxy product is obtained.

Support matrix A comprises blockcopolymer 1 (a polyol component) and Desmodur XP2410 (an NCO component). There is a 10% excess of OH in support matrix A.

Support matrix B comprises blockcopolymer 2 (a polyol component) and Desmodur XP2410 (an NCO component). There is a 10% excess of OH in support matrix B.

Example 1

Formulations were prepared including DRED 1 using the following procedure: This procedure was conducted under red lighting conditions to protect formulations from premature photoinitiation. Into a 20 ml vial was weighed 0.014 g Darocur TPO, 0.245 g monomer 1 and 5.06 g blockcopolymer 1, a magnetic stir bar was added, the vial was tightly capped and the mixture was stirred at room temperature until all materials had dissolved completely. Into a separate 20 ml vial was weighed 0.014 g DRED 1 and 3.34 g Desmodur XP2410. A magnetic stir bar and 2 ul of dibutyltin dilaurate were added, the vial was tightly capped and the mixture was stirred overnight at room temperature to ensure complete reaction of the immobilizing group with the isocyanate. Next, 1.68 g of the homogeneous solution from the second vial was added to the blockcopolymer solution and the resulting mixture stirred well and placed under vacuum. After several minutes a sufficient portion of the still liquid formulation was poured onto a glass slide such that when covered by a second glass slide separated from the first by spacers that full contact of both slides by the formulation was achieved. The formulation was then allowed to solidify while protected from moisture. This procedure produces a formulation that is 0.1 wt % DRED 1, 3.5 wt % monomer 1, 0.2 wt % Darocur TPO in support matrix A.

The M/# performance of the formulations was measured and the results of these measurements are shown in Table 1 below:

TABLE 1

| Sample | DRED wt % | Monomer | Monomer wt % | Normalized M Number (M/#/200 μm) |
|---|---|---|---|---|
| 1 | 0.097 | Monomer 1 | 2.45 | 4.17 |
| 2 | 0.1 | Monomer 1 | 2.5 | 4.12 |
| 3 | 0.05 | Monomer 1 | 2.9 | 3.81 |
| 4 | 0.10 | Monomer 1 | 3.5 | 5.82 |
| 5 | 0.10 | Monomer 1 | 3.5 | 6.05 |
| 6 | 0.16 | Monomer 1 | 3.5 | 6.77 |
| 7 | 0.72 | Monomer 1 | 3.5 | 2.35 |
| 8 | 0.048 | Monomer 1 | 3.5 | 5.02 |
| 9 | 0.16 | Monomer 1 | 3.5 | 6.09 |
| 10 | 0.21 | Monomer 1 | 3.9 | 6.45 |
| 11 | 0.10 | Monomer 2 | 2.9 | 5.11 |
| 12 | 0.10 | Monomer 2 | 2.4 | 4.03 |
| 13 | 0.15 | Monomer 2 | 3.5 | 5.03 |
| 14 | 0.15 | none | 0 | 0.2 |

Example 2

Formulations including DRED 2 and support matrix A (except that the formulation for sample 24 included support matrix B instead of support matrix A) were prepared using the procedures described above in Example 1 and the M/# performance of these formulations was measured. The results of these measurements are shown in Table 2 below:

TABLE 2

| Sample | DRED wt % | Monomer | Monomer wt % | Normalized M Number (M/#/200 μm) |
|---|---|---|---|---|
| 15 | 0.05 | Monomer 1 | 2.0 | 3.91 |
| 16 | 0.10 | Monomer 1 | 2.0 | 4.82 |
| 17 | 0.10 | Monomer 1 | 2.0 | 4.67 |
| 18 | 0.15 | Monomer 1 | 2.0 | 4.58 |
| 19 | 0.05 | Monomer 1 | 3.5 | 5.81 |
| 20 | 0.05 | Monomer 1 | 3.5 | 6.01 |
| 21 | 0.11 | Monomer 1 | 3.5 | 7.10 |
| 22 | 0.15 | Monomer 1 | 3.5 | 7.91 |
| 23 | 0.20 | Monomer 1 | 3.5 | 5.65 |
| 24* | 0.15 | Monomer 1 | 3.5 | 9.96 |

*Formulation 24 included support matrix B. All other formulations included support matrix A.

Example 3

A formulation including DRED 3 and support matrix A was prepared using the procedures described above in Example 1 and the M/# performance of this formulation was measured. The results of these measurements are shown in Table 3 below:

| Sample | DRED wt % | Monomer | Monomer wt % | Normalized M Number (M/#/200 μm) |
|---|---|---|---|---|
| 25 | 0.15 | Monomer 1 | 3.5 | 6.85 |

Example 4

Formulations including DRED 4 and support matrix A were prepared using the procedures described above in Example 1 and the M/# performance of these formulations was measured. The results of these measurements are shown in Table 4 below:

TABLE 4

| Sample | DRED wt % | Monomer | Monomer wt % | Normalized M Number (M/#/200 μm) |
|---|---|---|---|---|
| 26 | 0.1 | Monomer 1 | 3.5 | 5.79 |
| 27 | 0.15 | Monomer 1 | 3.5 | 6.26 |
| 28 | 0.2 | Monomer 1 | 3.5 | 6.83 |

Example 5

Formulations including DRED 5 and support matrix A were prepared using the procedures described above in Example 1 and the M/# performance of these formulations was measured. The results of these measurements are shown in Table 5 below:

TABLE 5

| Sample | DRED wt % | Monomer | Monomer wt % | Normalized M Number (M/#/200 μm) |
|---|---|---|---|---|
| 29 | 0.15 | Monomer 1 | 3.5 | 5.19 |
| 30 | 0.2 | Monomer 1 | 3.5 | 5.22 |
| 31 | 0.2 | Monomer 1 | 3.5 | 5.17 |
| 32 | 0.2 | Monomer 1 | 3.5 | 5.08 |

Example 6

A formulation including DRED 6 and support matrix A was prepared using the procedures described above in Example 1 and the M/# performance of this formulation was measured. The result of this test is shown in Table 6 below:

TABLE 6

| Sample | DRED wt % | Monomer | Monomer wt % | Normalized M Number (M/#/200 μm) |
|---|---|---|---|---|
| 33 | 0.15 | Monomer 1 | 3.5 | 4.61 |

Example 7

Formulations including DRED 7 and support matrix A were prepared using the procedures described above in Example 1 and the M/# performance of this formulation was measured. The results of these measurements are shown in Table 7 below:

TABLE 7

| Sample | DRED wt % | Monomer | Monomer wt % | Normalized M Number (M/#/200 μm) |
|---|---|---|---|---|
| 34 | 0.15 | Monomer 1 | 3.5 | 4.56 |
| 35 | 0.5 | Monomer 1 | 3.5 | 3.74 |

Example 8

A formulation including DRED 8 and support matrix A was prepared using the procedures described above in Example 1 and the M/# performance of this formulation was measured. The results of these measurements are shown in Table 8 below:

TABLE 8

| Sample | DRED wt % | Monomer | Monomer % | Normalized M Number (M/#/200 μm) |
|---|---|---|---|---|
| 36 | 0.15 | Monomer 1 | 3.5 | 5.15 |

Example 9

Formulations including DRED 9 and support matrix A were prepared using the procedures described above in Example 1, and also with the addition of 1 wt % of the plasticizer NMP. The M/# performance of these formulations was measured. The results of these measurements are shown in Table 9 below and shown in FIG. 6:

TABLE 9

| Sample | DRED wt % | Monomer | Monomer wt % | NMP wt % | Normalized M Number (M/#/200 μm) |
|---|---|---|---|---|---|
| 37 | 0.02 | Monomer 1 | 3.5 | 1 | 6.10 |
| 38 | 0.05 | Monomer 1 | 3.5 | 1 | 9.48 |
| 39 | 0.11 | Monomer 1 | 3.5 | 1 | 15.49 |
| 40 | 0.14 | Monomer 1 | 3.5 | 1 | 19.39 |
| 41 | 0.23 | Monomer 1 | 3.5 | 1 | 1.34 |
| 42 | 0.08 | Monomer 1 | 3.5 | 0 | 15.78 |
| 43 | 0.10 | Monomer 1 | 3.5 | 0 | 16.71 |
| 44 | 0.14 | Monomer 1 | 3.5 | 0 | 9.09 |

Example 10

Formulations comprising 3.5 wt % monomer 1 in support matrix A were made. One article included no DRED. The other nine (13) articles included one of the following dynamic range enhancing dopants: DRED 1, DRED 2, DRED 3, DRED 4, DRED 5, DRED 6, DRED 7, DRED 8, DRED 9, DRED 10, DRED 11, DRED 12 or DRED 13. M/#/200μ was measured for each of the formulations. The results of these measurements are shown below in Table 10 and in FIG. 1:

TABLE 10

| DRED | Normalized M Number (M/#/200 μm) |
|---|---|
| No DRED | 4.15 |
| DRED 1 | 6.09 |
| DRED 2 | 7.91 |
| DRED 3 | 6.85 |
| DRED 4 | 6.83 |
| DRED 5 | 5.22 |
| DRED 6 | 4.61 |
| DRED 7 | 4.56 |
| DRED 8 | 5.15 |
| DRED 9 | 16.71 |
| DRED 10 | 5.81 |
| DRED 11 | 6.38 |
| DRED 12 | 8.20 |
| DRED 13 | 5.51 |

Example 11

Formulations with no DRED, with DRED 1 and with DRED 2 were prepared using 3.5 wt % monomer 1 with both support matrix A and support matrix B. Formulations were also made using support matrix A with DRED 9, with and without a plasticizer. M/#/200μ was measured for each of the formulations. The results of these measurements are shown below in Table 11 and in FIG. 4:

TABLE 11

| Support Matrix | DRED | Plasticizer | Normalized M Number (M/#/200 μm) |
|---|---|---|---|
| Support Matrix A | None | None | 4.15 |
| Support Matrix B | None | None | 4.18 |
| Support Matrix A | DRED 1 | None | 6.09 |
| Support Matrix B | DRED 1 | None | 6.77 |
| Support Matrix A | DRED 2 | None | 7.91 |
| Support Matrix B | DRED 2 | None | 9.96 |
| Support Matrix A | DRED 9 | None | 16.71 |
| Support Matrix A | DRED 9 | 1 wt % NMP | 19.39 |

Example 12

Formulations with no DRED and DRED 1 were prepared using 3.5 wt % monomer 1 and 3.5 wt % monomer 2 both in support matrix A. M/#/200μ was measured for each of the formulations. The results of these measurements are shown below in Table 12 and in FIG. 5:

TABLE 12

| DRED | Monomer | Normalized M Number (M/#/200 μm) |
|---|---|---|
| None | Monomer 1 | 4.15 |
| DRED 1 | Monomer 1 | 6.09 |
| None | Monomer 2 | 3.66 |
| DRED 1 | Monomer 2 | 5.03 |

Example 13

Formulations were prepared including compounds A, B, C, D, E, F, G, and H using the procedures described above in Example 1 and the M/# performance of these formulations was measured. The results of these measurements are shown in Table 13 below:

TABLE 13

| Compound | Compound wt % | Monomer | Monomer wt % | Normalized M Number (M/#/200 μm) |
|---|---|---|---|---|
| A | 0.15 | Monomer 1 | 3.5 | 4.05247 |
| A | 0.3 | Monomer 1 | 3.5 | 3.72685167 |
| B | 0.15 | Monomer 1 | 3.5 | 4.00705 |
| C | 0.15 | Monomer 1 | 3.5 | 4.225724 |
| D | 0.15 | Monomer 1 | 3.5 | 4.14 |
| E | 0.15 | Monomer 1 | 3.5 | 4.14214 |
| F | 0.1 | Monomer 1 | 3.5 | 1.9278 |
| G | 0.1 | Monomer 1 | 3.5 | 4.24783 |
| H | 0.15 | Monomer 1 | 3.5 | 4.17599 |

No significant increase in M/# is measured in any of the formulations in this example.

Example 14

Formulations were made using support matrix A, 2 wt % monomer and 0.4 wt % benzhydrol with varying concentrations of DRED 9 and no added DRED 9. M/#/200μ was measured for each of the formulations. The results of these measurements are shown below in Table 14 and in FIG. 7:

TABLE 14

| DRED 9 wt % | Normalized M Number (M/#/200 μm) |
|---|---|
| 0 | 2.4 |
| 0.03 | 4.67 |
| 0.05 | 6.14 |
| 0.07 | 6.64 |
| 0.09 | 8.35 |

The results of Table 14 demonstrate that the ability of DRED 9 to enhance the dynamic range of an optical article is reduced but is still observable, even in systems with a polymerization retarder such as benzhydrol. However, the effect of DRED 9 on enhancing the dynamic range of the optical article is somewhat reduced by the presence of a polymerization retarder such as benzhydrol. This may indicate that the benzhydrol is able to in many instances intercept a radical polymer chain as it is forming and quench the chain before the chain is able to interact with DRED 9.

Example 15

Formulations were made using support matrix A, 2 wt % monomer 1 and 0.035% DRED 9 with varying concentrations of benzhydrol. M/#/200μ was measured for each of the formulations. The results of these measurements are shown below in Table 15 and in FIG. 8:

TABLE 15

| Benzhydrol wt % | Normalized M Number (M/#/200 μm) |
|---|---|
| 0.11 | 5.34 |
| 0.21 | 4.99 |
| 0.41 | 4.46 |

The results of Table 15 show that M/#/200 μm declines as the concentration of benzhydrol increases for constant monomer and DRED 9 concentrations.

Example 16

Formulations were made using support matrix A, 2 wt % monomer 1 and 0.032% DRED with no allyl thiourea and 0.39 wt % allyl thiourea. M/#/200μ was measured for each of the formulations. The results of these measurements are shown below in Table 16 and in FIG. 9:

TABLE 16

| Allyl Thiourea wt % | Normalized M Number (M/#/200 μm) |
|---|---|
| 0 | 5.9 |
| 0.39 | 4.14 |

The results of table 16 show that M/#/200 μm declines with the addition allyl thiourea for constant monomer and DRED 9 concentrations.

While the present invention has been disclosed with references to certain embodiments, numerous modification, alterations, and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A holographic storage medium comprising:
    a support matrix;
    a photoactive monomer;
    a photoinitiator;
    a dynamic range enhancing dopant (DRED) including a radical trap group and an immobilizing group, wherein;
        the DRED is present in an amount of less than 0.72 wt %;
        the radical trap group is capable of covalently attaching to a growing polymer chain formed from the photoactive monomer;
        the immobilizing group is covalently attached to the support matrix; and
        the holographic storage medium has an M/# per 200 μm medium at least 1.5 times the value of the same holographic storage medium without the DRED.

2. The holographic storage medium of claim 1, wherein the holographic storage medium has a dynamic range that is 2 times or more the value of the dynamic range of the same holographic storage medium without the DRED.

3. The holographic storage medium of claim 1, wherein the holographic storage medium has a dynamic range that is 3 times or more the value of the dynamic range of the same holographic storage medium without the DRED.

4. The holographic storage medium of claim 1, wherein the holographic storage medium has a dynamic range that is 4 times or more the value of the dynamic range of the same holographic storage medium without the DRED.

5. The holographic storage medium of claim 1, wherein the DRED comprises less than 0.23 wt % of the holographic storage medium.

6. The holographic storage medium of claim 1, wherein the DRED comprises 0.02 wt % to 0.72 wt % of the holographic storage medium.

7. The holographic storage medium of claim 1, wherein the radical trap group is selected from the group consisting of an alkenyl group, a nitro group, a nitrone group, and an aminoxyl group.

8. The holographic storage medium of claim 1, wherein the alkenyl group is not sterically hindered.

9. The holographic storage medium of claim 8, wherein the immobilizing group is selected from the group consisting of a hydroxyl group, an amine group, a carboxylic acid group, and an isocyanate group.

10. The holographic storage medium of claim 1, wherein the radical trap group is a dithioester group.

11. The holographic storage medium of claim 1, wherein the immobilizing group is selected from the group consisting of an hydroxyl group, an amine group, a carboxylic acid group, and an isocyanate group.

12. The holographic storage medium of claim 1, further comprising in its composition an unbound polymerization retarder capable of diffusion.

13. The holographic storage medium of claim 1, wherein the support matrix is a thermoset polyurethane.

14. The holographic storage medium of claim 1, wherein the DRED includes an aminoxyl group.

15. A method of recording to a holographic storage medium comprising:
    synthesizing the holographic storage medium, said synthesizing the holographic storage medium including:
        synthesizing a support matrix, said synthesizing a support matrix including covalently attaching a DRED to the support matrix, wherein:
            the DRED is present in an amount of less than 0.72 weight percent;
            the DRED includes a radical trap group; and the holographic storage medium has an M/# per 200 µm medium at least 1.3 times the value of the same holographic storage medium without the DRED;

recording holographic data in the holographic storage medium by polymerizing a photoactive monomer to create a growing polymer chain in the holographic storage medium; and covalently attaching the growing polymer chain to the radical trap group.

16. The method of claim 15, wherein said covalently attaching the growing polymer chain to the radical trap group occurs while recording data in the holographic storage medium.

* * * * *

UNITED STATES PATENT AND TRADEMARK OFFICE
CERTIFICATE OF CORRECTION

PATENT NO.        : 8,658,332 B2                            Page 1 of 1
APPLICATION NO.   : 13/667724
DATED             : February 25, 2014
INVENTOR(S)       : Fredric R. Askham It is certified that error appears in the above-identified patent and that said Letters Patent is hereby corrected as shown below:

In the Claims

Column 36, Claim 8, line 39, the term "claim 1" in claim 8 should be changed to "claim 7" so that claim 8 is dependent on claim 7.

Signed and Sealed this
Twenty-second Day of July, 2014

Michelle K. Lee
*Deputy Director of the United States Patent and Trademark Office*